United States Patent
Du et al.

(10) Patent No.: US 11,515,379 B2
(45) Date of Patent: Nov. 29, 2022

(54) DISPLAY SUBSTRATE INCLUDING CONFIGURATION OF INSULATION LAYERS COVERING CONTACT PADS IN BONDING REGION, AND MANUFACTURING METHOD THEREOF

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Mengmeng Du, Beijing (CN); Xiangdan Dong, Beijing (CN); Hongwei Ma, Beijing (CN); Jun Yan, Beijing (CN); Bo Cheng, Beijing (CN); Biao Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 268 days.

(21) Appl. No.: 16/768,323

(22) PCT Filed: Oct. 23, 2019

(86) PCT No.: PCT/CN2019/112786
§ 371 (c)(1),
(2) Date: May 29, 2020

(87) PCT Pub. No.: WO2021/077332
PCT Pub. Date: Apr. 29, 2021

(65) Prior Publication Data
US 2022/0005909 A1 Jan. 6, 2022

(51) Int. Cl.
*H01L 27/32* (2006.01)

(52) U.S. Cl.
CPC ...... *H01L 27/3276* (2013.01); *H01L 27/3218* (2013.01); *H01L 27/3262* (2013.01); *H01L 2227/323* (2013.01)

(58) Field of Classification Search
CPC ............ H01L 27/3218; H01L 27/3262; H01L 27/3276
(Continued)

(56) References Cited

U.S. PATENT DOCUMENTS 10,304,965 B2 5/2019 Wang et al.
2006/0097265 A1 5/2006 Jeong et al.
(Continued)

FOREIGN PATENT DOCUMENTS

CN 1955792 A 5/2007
CN 107154402 A 9/2017
(Continued)

OTHER PUBLICATIONS

Extended European Search Report from Application No. 19945403.4 dated Sep. 21, 2022.

*Primary Examiner* — Matthew E. Gordon
(74) *Attorney, Agent, or Firm* — Dilworth & Barrese, LLP.; Michael J. Musella, Esq.

(57) ABSTRACT

A display substrate and a manufacturing method thereof, and a display device are disclosed. The display substrate includes a base substrate, a plurality of sub-pixels at least one group of contact pads, and a first insulation layer. The base substrate includes a display region and a bonding region located at one side of the display region. The least one group of contact pads includes a plurality of contact pads, at least one of the plurality of contact pads includes a first contact pad metal layer and a second contact pad metal layer, the second contact pad metal layer covers an edge of the first contact pad metal layer. The first insulation layer is located
(Continued)

in gaps between the plurality of contact pads and covers edges of the plurality of contact pads, and is configured to expose surfaces of the plurality of contact pads facing away from the base substrate.

19 Claims, 9 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2017/0345882 A1 | 11/2017 | Nam et al. | |
| 2018/0144950 A1* | 5/2018 | Jeong | H01L 21/32135 |
| 2019/0163304 A1 | 5/2019 | Shim et al. | |
| 2019/0198589 A1* | 6/2019 | Choi | H01L 27/3276 |
| 2019/0207161 A1 | 7/2019 | Lee et al. | |
| 2020/0019281 A1* | 1/2020 | Miyamoto | G06F 3/041 |
| 2020/0091269 A1* | 3/2020 | Okabe | H01L 51/003 |
| 2022/0140058 A1* | 5/2022 | Jung | H01L 27/1248 |
| | | | 257/40 |

FOREIGN PATENT DOCUMENTS

| | | | |
|---|---|---|---|
| CN | 110095889 A | * | 8/2019 |
| CN | 110095889 A | | 8/2019 |
| WO | 2019064592 A1 | | 4/2019 |

* cited by examiner

DISPLAY SUBSTRATE INCLUDING CONFIGURATION OF INSULATION LAYERS COVERING CONTACT PADS IN BONDING REGION, AND MANUFACTURING METHOD THEREOF

TECHNICAL FIELD

Embodiments of the present disclosure relate to a display substrate and a manufacturing method thereof, and a display device.

BACKGROUND

With the increasing demand of users for organic light-emitting diode (OLED) display devices and higher product quality requirements, the rapid development of the display device has been promoted. In recent years, the resolution of the display device is getting higher and higher, and the bezel of the display device is getting narrower and narrower, so that the pixel size of the backplane circuit of the display device is gradually reduced.

SUMMARY

At least one embodiment of the present disclosure provides a display substrate, which includes a base substrate, a plurality of sub-pixels, a plurality of data lines, a plurality of data leads, at least one group of contact pads, and a first insulation layer. The base substrate includes a display region and a bonding region located at at least one side of the display region; the plurality of sub-pixels are located in the display region; the plurality of data lines are located in the display region and configured to provide data signals to the plurality of sub-pixels; the plurality of data leads are located in the bonding region and electrically connected with the plurality of data lines; the at least one group of contact pads are located in the bonding region, the at least one group of contact pads include a plurality of contact pads, at least one of the plurality of contact pads includes a first contact pad metal layer and a second contact pad metal layer, the first contact pad metal layer is located on a side of the plurality of data leads away from the base substrate and is electrically connected with one of the plurality of data leads, the second contact pad metal layer is located on a side of the first contact pad metal layer away from the base substrate and is electrically connected with the first contact pad metal layer, and the second contact pad metal layer covers an edge of the first contact pad metal layer; the first insulation layer is located in the bonding region, the first insulation layer is located in gaps between the plurality of contact pads and covers edges of the plurality of contact pads, and is configured to expose surfaces of the plurality of contact pads facing away from the base substrate.

For example, in the display substrate provided by at least one embodiment of the present disclosure, a vertical distance between a surface of a side of the first insulation layer away from the base substrate and the base substrate is not greater than a vertical distance between a surface of a side of the plurality of contact pads away from the base substrate and the base substrate.

For example, in the display substrate provided by at least one embodiment of the present disclosure, edges of the second contact pad metal layer are covered by the first insulation layer.

For example, in the display substrate provided by at least one embodiment of the present disclosure, the at least one group of contact pads include a first group of contact pads and a second group of contact pads, the first group of contact pads and the second group of contact pads respectively include a plurality of contact pads, the second group of contact pads are located at a side of the first group of contact pads close to the display region, and the plurality of data leads are electrically connected with the first group of contact pads and the second group of contact pads in one-to-one correspondence.

For example, in the display substrate provided by at least one embodiment of the present disclosure, at least a portion of the first insulation layer is located in gaps between adjacent contact pads of the first group of contact pads.

For example, in the display substrate provided by at least one embodiment of the present disclosure, at least a portion of the first insulation layer is located in gaps between adjacent contact pads of the second group of contact pads.

For example, in the display substrate provided by at least one embodiment of the present disclosure, at least a portion of the first insulation layer is located in gaps between adjacent contact pads of the first group of contact pads, and is further located in gaps between adjacent contact pads of the second group of contact pads.

For example, in the display substrate provided by at least one embodiment of the present disclosure, the plurality of contact pads of the first group of contact pads are arranged in at least a first row, and the plurality of contact pads of the second group of contact pads are arranged in at least a second row; a row direction of the first row and a row direction of the second row are parallel to an extension direction of a side edge of the display region facing the bonding region, and at least a portion of the first insulation layer is located in a gap between the first row and the second row.

For example, in the display substrate provided by at least one embodiment of the present disclosure, at least one of the plurality of sub-pixels comprises a pixel drive circuit, a first planarization layer, a first transfer electrode, a second planarization layer, and a light emitting element, the first planarization layer is located on a side of the pixel drive circuit away from the base substrate to provide a first planarization surface and comprises a first via hole, the first transfer electrode is on the first planarization surface and is electrically connected with the pixel drive circuit through the first via hole, the second planarization layer is located on a side of the first transfer electrode away from the base substrate to provide a second planarization surface and comprises a second via hole, the light emitting element is on the second planarization surface and is electrically connected with the first transfer electrode through the second via hole, and the first insulation layer and the second planarization layer are provided at a same layer.

For example, in the display substrate provided by at least one embodiment of the present disclosure, the pixel drive circuit comprises a first display region metal layer, the first display region metal layer and the first contact pad metal layer are provided at a same layer, and the first transfer electrode and the second contact pad metal layer are provided at a same layer.

For example, in the display substrate provided by at least one embodiment of the present disclosure, the pixel drive circuit comprises a thin film transistor, the thin film transistor comprises a source electrode and a drain electrode, and the source electrode and the drain electrode are located in the first display region metal layer and are located on the same layer as the first display region metal layer.

For example, in the display substrate provided by at least one embodiment of the present disclosure, at least one of the plurality of sub-pixels further comprises a passivation layer, and the passivation layer is located between the pixel drive circuit and the first planarization layer and comprises a passivation layer via hole, the pixel drive circuit and the first transfer electrode are further electrically connected through the passivation layer via hole, the display substrate further comprises a second insulation layer located in the bonding region, the second insulation layer is between the first contact pad metal layer and the second contact pad metal layer and covers edges of the first contact pad metal layer, the second insulation layer comprises first contact pad via holes, and the second contact pad metal layer is electrically connected with the first contact pad metal layer through the first contact pad via holes, and the second insulation layer and the passivation layer are provided at a same layer.

For example, in the display substrate provided by at least one embodiment of the present disclosure, at least one of the plurality of sub-pixels further comprises a storage capacitor, the storage capacitor comprises two capacitor electrodes, the thin film transistor further comprises a gate electrode, at least one of the plurality of data leads and one of the two capacitor electrodes of the storage capacitor are provided at the same layer as the gate electrode.

For example, the display substrate provided by at least one embodiment of the present disclosure further includes: a bonding region interlayer insulation layer, located in the bonding region, located between the plurality of contact pads and the plurality of data leads, and located between the first insulation layer and the base substrate; a bonding region first gate insulation layer, located in the bonding region, and located at a side of the bonding region interlayer insulation layer close to the base substrate; and a bonding region second gate insulation layer, located in the bonding region, located between the bonding region first gate insulation layer and the bonding region interlayer insulation layer, and laminated with the bonding region interlayer insulation layer; and the bonding region second gate insulation layer comprises first contact pad via holes, the bonding region interlayer insulation layer comprises second contact pad via holes, and at least one of the plurality of data leads is electrically connected with at least one of the plurality of contact pads through the first contact pad via holes and the second contact pad via holes.

For example, in the display substrate provided by at least one embodiment of the present disclosure, at least one of the plurality of sub-pixels further comprises a display region interlayer insulation layer, a display region first gate insulation layer, and a display region second gate insulation layer, the display region interlayer insulation layer, the display region first gate insulation layer, and the display region second gate insulation layer are respectively provided at the same layer as the bonding region interlayer insulation layer, the bonding region first gate insulation layer, and the bonding region second gate insulation layer; the display region interlayer insulation layer is located between the gate electrode and the source electrode, and the drain electrode, the display region first gate insulation layer is located at a side of the display region interlayer insulation layer close to the base substrate, and the display region second gate insulation layer is located between the display region interlayer insulation layer and the display region first gate insulation layer; and the two capacitance electrodes comprise a first capacitance electrode and a second capacitance electrode, the first capacitance electrode is provided at the same layer as the gate electrode, and the second capacitance electrode is provided between the display region interlayer insulation layer and the display region second gate insulation layer.

For example, the display substrate provided by at least one embodiment of the present disclosure further includes a bonding region third insulation layer, the bonding region third insulation layer is located in the bonding region, and is provided on a side of the first insulation layer and the plurality of contact pads away from the base substrate to cover the first insulation layer and the plurality of contact pads, and the bonding region third insulation layer comprises third contact pad via holes to expose surfaces of the plurality of the contact pads.

For example, the display substrate provided by at least one embodiment of the present disclosure further includes an encapsulation layer and a display region third insulation layer that are located in the display region, the encapsulation layer is located on a side of the light emitting element away from the base substrate, the display region third insulation layer is located on a side of the encapsulation layer away from the base substrate, and the bonding region third insulation layer and the display region third insulation layer are located at a same layer.

For example, the display substrate provided by at least one embodiment of the present disclosure further includes an auxiliary conductive layer, the auxiliary conductive layer is located in the bonding region and is provided on a side of the bonding region third insulation layer away from the base substrate, the auxiliary conductive layer comprises a second transfer electrode pattern located in the bonding region, and the second transfer electrode pattern is electrically connected with the plurality of contact pads through the third contact pad via holes.

For example, the display substrate provided by at least one embodiment of the present disclosure further includes an auxiliary electrode layer provided on the display region third insulation layer, the auxiliary electrode layer and the second transfer electrode pattern are provided at a same layer.

For example, in the display substrate provided by at least one embodiment of the present disclosure, in the bonding region, a height of the second transfer electrode pattern relative to a surface of the base substrate is not greater than a height of the bonding region third insulation layer relative to the surface of the base substrate.

At least one embodiment of the present disclosure further provides a display device, which includes the display substrate provided by any one of the embodiments of the present disclosure.

At least one embodiment of the present disclosure further provides a manufacturing method of a display substrate, which includes: providing a base substrate, in which the base substrate includes a display region and a bonding region located at at least one side of the display region; forming a plurality of sub-pixels in the display region; forming a plurality of data lines in the display region, in which the plurality of data lines are configured to provide data signals to the plurality of sub-pixels; forming a plurality of data leads in the bonding region, in which the plurality of data leads are electrically connected with the plurality of data lines; forming at least one group of contact pads in the bonding region, in which the at least one group of contact pads include a plurality of contact pads, at least one of the plurality of contact pads includes a first contact pad metal layer and a second contact pad metal layer, the first contact pad metal layer is formed to be located on a side of the plurality of data leads away from the base substrate and is electrically connected with one of the plurality of data leads, the second contact pad metal layer is formed to be located on a side of the first contact pad metal layer away from the base substrate and is electrically connected with the first contact pad metal layer, and the second contact pad metal layer covers an edge of the first contact pad metal layer; and forming a first insulation layer in the bonding region, in which the first insulation layer is located in gaps between the plurality of contact pads and covers edges of the plurality of contact pads, and is configured to expose surfaces of the plurality of contact pads facing away from the base substrate.

For example, in the manufacturing method provided by at least one embodiment of the present disclosure, forming the first insulation layer includes: causing a height of the first insulation layer relative to a surface of the base substrate is not greater than a height of the plurality of contact pads relative to the surface of the base substrate.

For example, in the manufacturing method provided by at least one embodiment of the present disclosure, forming the plurality of sub-pixels in the display region includes: forming the plurality of sub-pixels in the display region, in which at least one of the plurality of sub-pixels includes a pixel drive circuit, a first planarization layer, and a light emitting element, forming the plurality of sub-pixels in the display region includes: forming the pixel drive circuit on the base substrate, forming the first planarization layer on a side of the pixel drive circuit away from the base substrate to provide a first planarization surface and forming a first via hole in the first planarization layer, forming a first transfer electrode on the first planarization surface, in which the first transfer electrode is electrically connected with the pixel drive circuit through the first via hole, forming a second planarization layer on a side of the first transfer electrode away from the base substrate to provide a second planarization surface and forming a second via hole in the second planarization layer, in which the first insulation layer and the second planarization layer are formed by a same second insulation material layer; forming the light emitting element on the second planarization surface, in which the light emitting element is electrically connected with the first transfer electrode through the second via hole.

For example, in the manufacturing method provided by at least one embodiment of the present disclosure, forming the first insulation layer and the second planarization layer through the same first insulation material layer includes: depositing a first insulation material layer on the base substrate after the plurality of contact pads and the pixel drive circuit are formed; performing a patterning process on the first insulation material layer such that a portion of the first insulation material layer located in the display region is formed as the second planarization layer and the second via hole is formed in the second planarization layer, removing a portion of the first insulation material layer overlapping with the plurality of the contact pads, and thinning a portion of the first insulation material layer located in the bonding region and located at edges of the plurality of the contact pads to form the first insulation layer.

For example, in the manufacturing method provided by at least one embodiment of the present disclosure, forming the first insulation layer and the second planarization layer through the same first insulation material layer includes: depositing a first insulation material layer on the base substrate after the plurality of contact pads and the pixel drive circuit are formed, in which the first insulation material layer includes photosensitive resin, exposing the first insulation material layer using a gray tone mask plate or a halftone mask plate, developing a photoresist that is exposed so that a portion of the first insulation material layer located in the display region is formed as the second planarization layer and the second via hole is formed in the second planarization layer, removing a portion of the first insulation material layer overlapping with the plurality of contact pads, and thinning a portion of the first insulation material layer located in the bonding region and located at edges of the plurality of the contact pads to form the first insulation layer.

For example, in the manufacturing method provided by at least one embodiment of the present disclosure, performing a patterning process on the first insulation material layer includes: patterning the first insulation material layer by using a gray mask plate patterning process or a halftone mask plate patterning process.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1A:
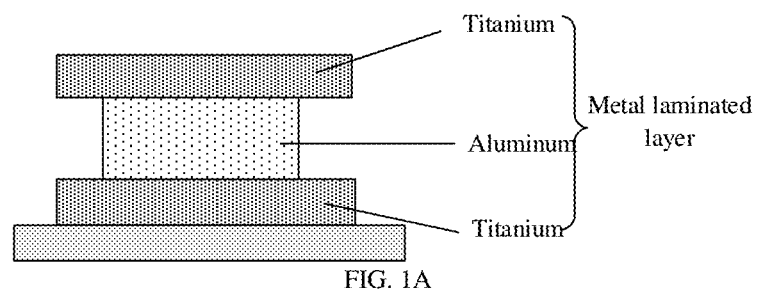
FIG. 1A is a schematic diagram of a three-layer metal laminated layer (Ti/Al/Ti) adopted by an electrode layer.

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," and the like are only used to indicate relative position relationship, and when the position of the described object is changed, the relative position relationship may be changed accordingly.

At present, the resolution of the organic light emitting diode (OLED) display device is getting higher and higher, and the bezel of the display device is getting narrower and narrower, so that the pixel size of the backplane circuit of the display device is gradually reduced. Because the width of circuit traces in the backplane circuit and the line spacing of the circuit traces are reduced, the metal residue and the etching loss in the etching process of the backplane circuit in actual manufacturing process are easy to cause short circuit of the backplane circuit, thus affecting the yield of the display device.

The inventors have noticed during research that in the manufacturing process of the backplane circuit of the display device, the anode of the OLED may adopt a wet etching process. During the etching process, the acid etching solution used is easy to cause serious over-etching to other metal layers already formed under the anode. For example, the display device includes a transfer electrode metal layer or a source-drain metal layer located below the OLED, the transfer electrode metal layer is electrically connected with the anode, and the source-drain metal layer is electrically connected with the transfer electrode metal layer. During the patterning process of forming the pattern of the anode, the over-etching phenomenon of the anode tends to cause a greater impact on the transfer electrode metal layer or the source-drain metal layer.

Figure 1B:
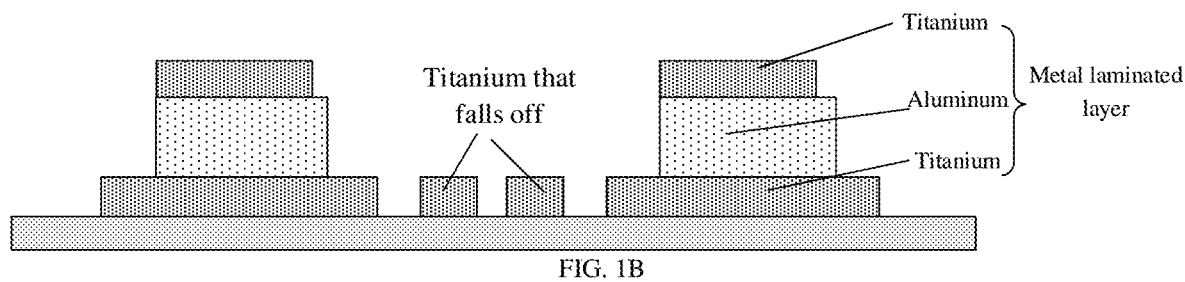
FIG. 1B is a schematic diagram of falling off of an edge of a three-layer metal laminated layer (Ti/Al/Ti)

As shown in FIG. 1A, for example, in the case where the transfer electrode metal layer or the source-drain metal layer is manufactured with a multi-metal laminated layer (for example, three-layer metal laminated layer (Ti/Al/Ti) composed of titanium, aluminum, and titanium), the aluminum metal layer located in the middle is easy to be over-etched by the acidic etching solution, thus causing an undercut phenomenon, and further causing the titanium metal layer located on the aluminum metal layer at the edge of the electrode pattern to become suspended. As shown in FIG. 1B, in other subsequent manufacturing processes of the display device, for example a high-pressure spray preparation process, the stripping phenomenon of titanium metal in the suspended part is easy to occur. The titanium metal that falls off is generally with the shape of a long strip, which is easy to remain in the display device, thus causing a signal shorted phenomenon in the backplane circuit of the display device.

In addition, when the display device displays a picture, the residual titanium metal that falls off easily leads to poor brightness and darkness of the display device. Especially in the bonding region of the display device for bonding external circuits, the problem of poor brightness and darkness is particularly prominent.

At least one embodiment of the present disclosure provides a display substrate and a manufacturing method thereof, and a display device. The display substrate includes a base substrate, a plurality of sub-pixels, a plurality of data lines, a plurality of data leads, at least one group of contact pads, and a first insulation layer. The base substrate includes a display region and a bonding region located at at least one side of the display region; a plurality of sub-pixels are located in the display region; the plurality of data lines are located in the display region and configured to provide data signals to the plurality of sub-pixels; the plurality of data leads are located in the bonding region and electrically connected with the plurality of data lines; the at least one group of contact pads are located in the bonding region, the at least one group of contact pads include a plurality of contact pads, at least one of the plurality of contact pads includes a first contact pad metal layer and a second contact pad metal layer, the first contact pad metal layer is located on a side of the plurality of data leads away from the base substrate and is electrically connected with one of the plurality of data leads, the second contact pad metal layer is located on a side of the first contact pad metal layer away from the base substrate and is electrically connected with the first contact pad metal layer, and the second contact pad metal layer covers an edge of the first contact pad metal layer; the first insulation layer is located in the bonding region, the first insulation layer is located in gaps between the plurality of contact pads and covers edges of the plurality of contact pads, and is configured to expose surfaces of the plurality of contact pads facing away from the base substrate.

In the display substrate described above, the first insulation layer, which is located in the bonding region of the display substrate, is located in the gaps between the plurality of contact pads and covers the edges of the plurality of contact pads, so that in the manufacturing process of the display substrate, the first insulation layer can protect the edges of metal layers of the plurality of contact pads, thereby preventing the etching solution, which is used in the subsequent process forming a transfer metal layer and the like, form etching the metal layers in the contact pads that are exposed, and preventing the stripping phenomenon of titanium metal of the suspended part, thereby improving the product yield and reliability of the display substrate.

In the following, a display substrate and a manufacturing method thereof, and a display device provided according to embodiments of the present disclosure are described with reference to the accompanying drawings.

It should be noted that in various accompanying drawings of the present disclosure, in order to clearly describe, a spatial rectangular coordinate system is established based on the base substrate of the display substrate, and the positions of various structures of the display substrate are explained accordingly. In the spatial rectangular coordinate system, a X axis and a Y axis are parallel to the plane of the base substrate, and a Z axis is perpendicular to the plane of the base substrate.

Figure 2A:
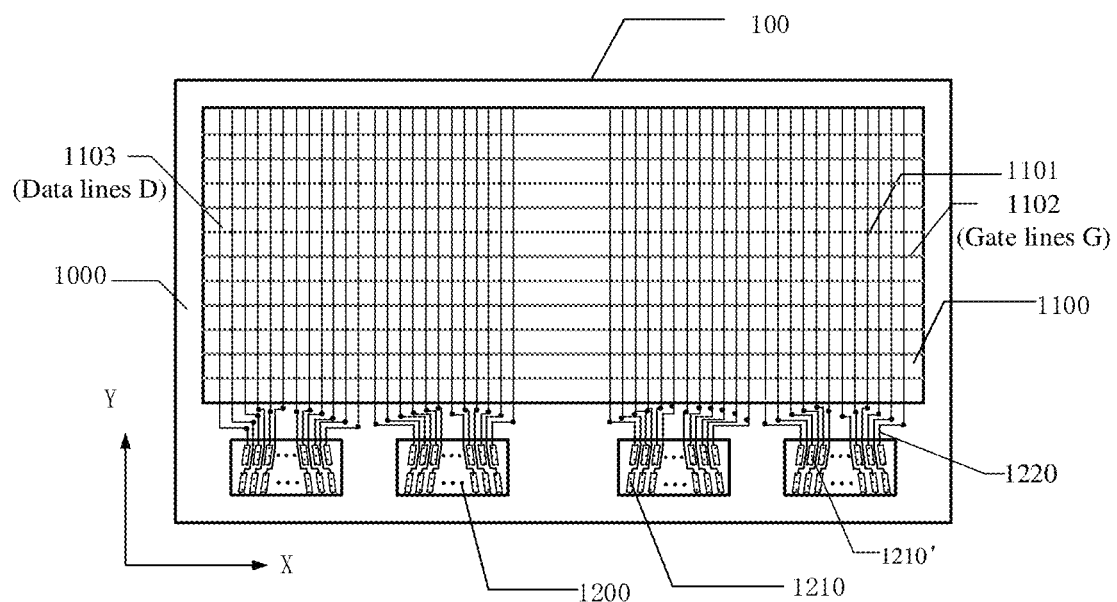
FIG. 2A is a schematic plan view of a display substrate according to at least one embodiment of the present disclosure.
Figure 2B:
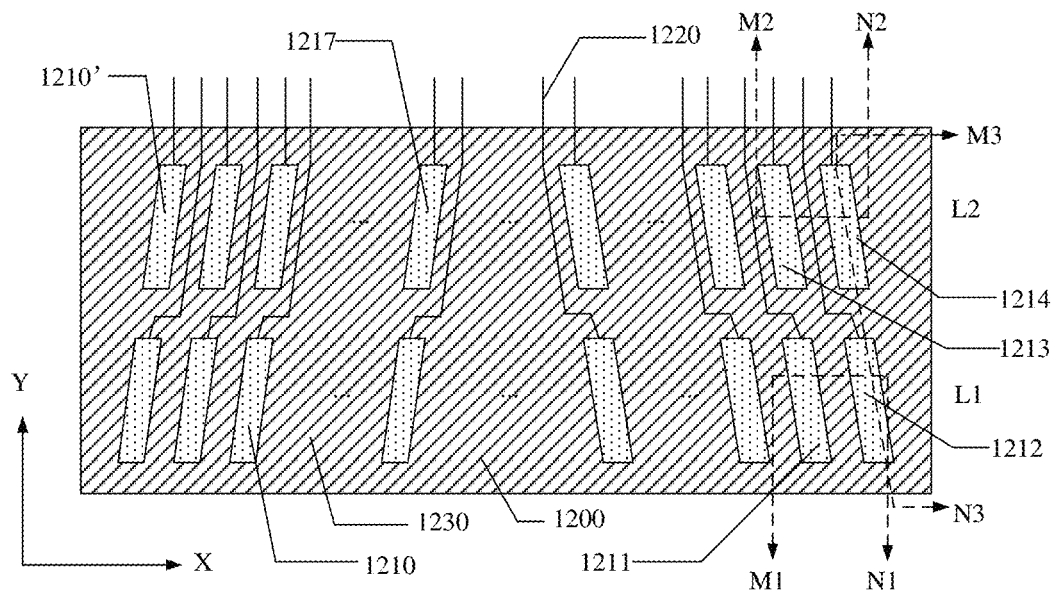
FIG. 2B is a schematic plan view of a bonding region of a display substrate according to an embodiment of the present disclosure.

At least one embodiment of the present disclosure provides a display substrate, and FIG. 2A is a schematic plan view of the display substrate. FIG. 2B is a schematic plan view of a bonding region of a display substrate according to an embodiment of the present disclosure. The display substrate is configured for, for example, an organic light emitting diode (OLED) display device or a quantum dot light emitting diode (QLED) display device.

For example, as shown in FIG. 2A and FIG. 2B, the display substrate 100 includes a base substrate 1000. The base substrate 1000 includes a display region 1100 and a peripheral region surrounding the display region 1100, and the peripheral region includes at least one bonding region 1200. Four bonding regions are shown in FIG. 2A, but the embodiments of the present disclosure are not limited thereto. The display region 1100 includes a pixel array, and scanning lines (gate lines), data lines, power lines, detection lines, etc., which are configured to provide control signals, data signals, voltage signals, etc., to the pixel array.

In the present embodiment, the display region 1100 includes a plurality of sub-pixels and a plurality of data lines 1101. The plurality of data lines 1101 include signal lines 1102 (for example, gate lines G) extending in a first direction (the X-axis direction in the FIG. 2A) and signal lines 1103 (for example, data lines D) extending in a second direction (the Y-axis direction in the FIG. 2A). The display substrate includes a plurality of leads 1220 (that is, data leads) located in the at least one bonding region 1200. These signal lines extend or trace to the bonding region located at at least one side of the display region 1100. For example, the signal lines 1103 are electrically connected with corresponding leads, and thus may be electrically connected with a drive chip, a flexible circuit board, etc., located in the bonding region.

For example, the at least one bonding region 1200 is located at a side of the display region 1100 for electrically connecting an external circuit with the display substrate through a bonding process. For example, the external circuit may include a chip-mounted flexible circuit board (for example, Chip on Film, COF), and a control chip or a drive chip and the like are arranged on the flexible circuit board. The bonding region may further be configured to electrically connected with chips directly. The display substrate 100 may further include at least one group of contact pads, and the at least one group of contact pads include a plurality of contact pads 1210 arranged in the at least one bonding region 1200. The plurality of leads 1220 are electrically connected with the plurality of contact pads 1210 in one-to-one correspondence. One end of the plurality of leads 1220 extends to the display region 1100 and is electrically connected with signal lines (for example, data lines) in the display region 1100, and the other end of the plurality of the leads 1220 extends to the at least one bonding region 1200 and is electrically connected with the plurality of contact pads 1210. The plurality of the leads 1220 are, for example, formed at the same layer as the signal lines in the display region 1100, and the plurality of the leads 1220 and the signal lines in the display region 1100 may thus be formed integrally. Or the plurality of the leads 1220 and the signal lines in the display region 1100 may be formed at different layers, thereby being electrically connected to each other through via holes in an insulation layer between the plurality of the leads 1220 and the signal lines in the display region 1100.

For example, as shown in FIG. 2B, in each of the at least one bonding region 1200, at least one group of contact pads include a plurality of contact pads 1210. The plurality of contact pads can further be divided into a first group of contact pads 1210 and a second group of contact pads 1210'. The second group of contact pads 1210' is located at one side of the first group of contact pads 1210 close to the display region 1100, and at least one of the plurality of leads 1220 is connected with the first group of contact pads 1210 and the second group of contact pads 1210'. The plurality of contact pads 1210 are arranged in a direction in which the display region 1100 faces the side of the at least one bonding region 1200, and may be arranged in a single row or multiple rows, for example, two rows, which are named as a L1 row (that is, a first row) and a L2 row (that is, a second row). Herein, the L2 row is located between the L1 row and the display region. As described above, the embodiments of the present disclosure do not limit the number of rows of the plurality of contact pads. Intervals are arranged between a plurality of contact pads 1210 in the same row, and intervals are further arranged between a plurality of contact pads 1210 in different rows. As shown in FIG. 2B, a sectional line M1-N1 passes through a contact pad 1211 and a contact pad 1212 in the L1 row, a sectional line M2-N2 passes through a contact pad 1213 and a contact pad 1214 in the L2 row, and the sectional line M3-N3 passes through the contact pad 1212 in the L1 row and the contact pad 1214 in the L2 row.

For example, the display substrate further includes a first insulation layer, and at least a portion of the first insulation layer is located in gaps between adjacent contact pads of the first group of contact pads. For example, at least a portion of the first insulation layer is located in gaps between adjacent contact pads of the second group of contact pads. For another example, at least a portion of the first insulation layer is located in the gaps between adjacent contact pads of the first group of contact pads, and is further located in the gaps between adjacent contact pads of the second group of contact pads.

For example, in some examples of the present disclosure, the height of the first insulation layer relative to the surface of the base substrate is not greater than the height of the plurality of contact pads relative to the surface of the base substrate. As shown in FIG. 2B, the display substrate may further include a first insulation layer 1230 arranged on the bonding region 1200. The first insulation layer 1230 covers at least part of edges of the plurality of contact pads 1210. The plurality of contact pads 1210 include at least one contact pad metal layer, such as a plurality of contact pad metal layers. The top metal layer of the at least one contact pad metal layer of the plurality of contact pads 1210 is exposed to realize electrical connection.

Figure 3A:
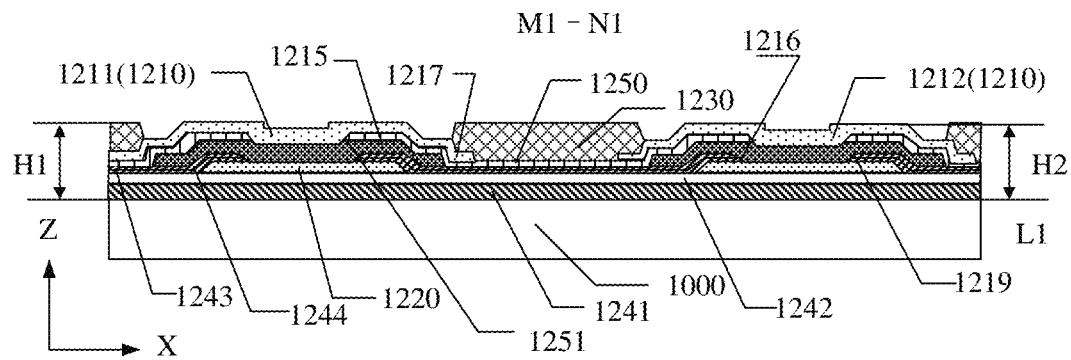
FIG. 3A is a schematic cross-sectional view taken along line M1-N1 of the display substrate as shown in FIG. 2B.
Figure 3B:
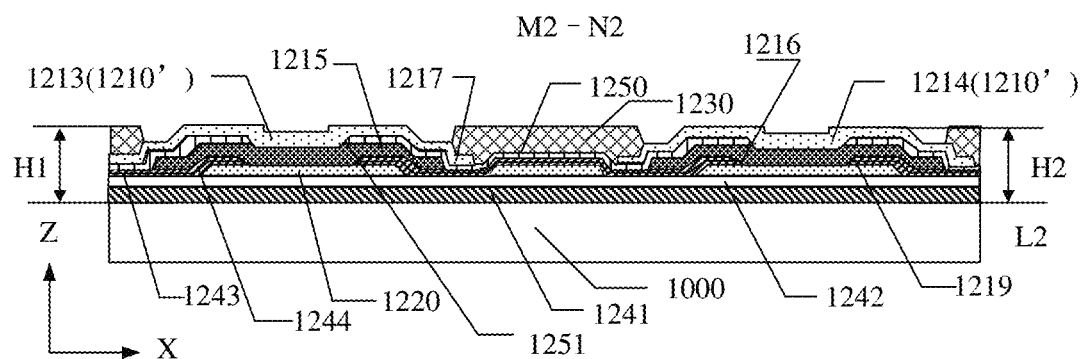
FIG. 3B is a schematic cross-sectional view taken along line M2-N2 of the display substrate as shown in FIG. 2B.
Figure 3C:
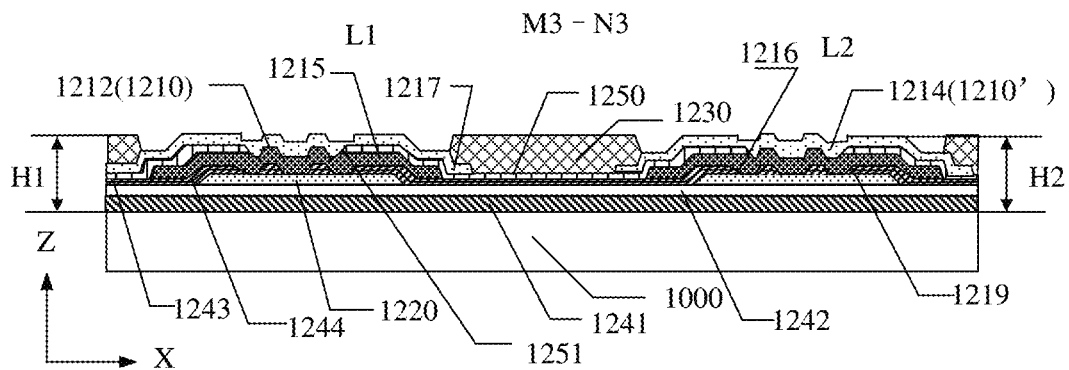
FIG. 3C is a schematic cross-sectional view taken along line M3-N3 of the display substrate as shown in FIG. 2B.

FIG. 3A is a schematic cross-sectional view taken along line M1-N1 of the display substrate as shown in FIG. 2B. FIG. 3B is a schematic cross-sectional view taken along line M2-N2 of the display substrate as shown in FIG. 2B. FIG. 3C is a schematic cross-sectional view taken along line M3-N3 of the display substrate as shown in FIG. 2B. As shown in FIG. 3A, FIG. 3B and FIG. 3C, the at least one contact pad metal layer of the plurality of contact pads 1210 may include a first contact pad metal layer 1215 and a second contact pad metal layer 1217, and the second contact pad metal layer 1217 is laminated on a side of the first contact pad metal layer 1215 away from the base substrate 1000. In the present structure mentioned above, the top metal layer of the at least one contact pad metal layer of the plurality of contact pads is the second contact pad metal layer 1217. The first insulation layer 1230 includes gaps corresponding to each of the plurality of contact pads 1210, thereby being configured to expose surfaces of the plurality of contact pads 1210 away from the base substrate 1000. A region outside the plurality of contact pads 1210 in the at least one bonding region 1200 is covered by the first insulation layer 1230, and the region includes but is not limited to gaps between contact pads of the same row and gaps between contact pads of different rows. Therefore, in the manufacturing process of the display substrate, the first insulation layer can protect the edges of the plurality of contact pads and prevent the etching solution in the subsequent patterning process from etching the edges of the contact pads which are exposed, thereby improving the product yield and reliability of the display substrate.

For example, the base substrate 1000 may be a glass plate, a quartz plate, a metal plate, a resin plate, etc. For example, the material of the base substrate may include an organic material, for example, the organic material may be a resin material such as polyimide, polycarbonate, polyacrylate, polyetherimide, polyethersulfone, polyethylene terephthalate, and polyethylene naphthalate, etc., the base substrate 1000 may be a flexible substrate or a non-flexible substrate, and the embodiments of the present disclosure are not limited thereto.

If the thickness of the first insulation layer is large, there is a large segment difference between the surface of the first insulation layer relative to the base substrate and the surface of the plurality of contact pads, and poor contact between the external circuit and the plurality of contact pads in the bonding region is easily to occur when a bonding process is performed on the external circuit in the bonding region. Especially for the flexible touch display device, due to the thicker metal laminated layer of the plurality of contact pads in the bonding region, in the case where the bonding process is performed on the external circuit, poor contact between the external circuit and the plurality of contact pads in the bonding region is more easily to occur at grooves on the top metal layer of the plurality of contact pads, which further affects the product yield of the display device. Therefore, in at least one example of the embodiment, the thickness of the plurality of contact pads is further controlled in order to avoid the poor contact in the bonding region.

In the present embodiment, the edges of the plurality of contact pads include the edges of the plurality of contact pads in a circumferential direction, that is, in a cross-sectional view obtained by passing a cross-sectional line in either direction through at least one of the plurality of contact pads, the edges of the least one of the plurality of contact pads is covered by the first insulation layer.

For example, as shown in FIG. 3A, FIG. 3B and FIG. 3C, the first insulation layer 1230 covers the edges of the second contact pad metal layer 1217. The second contact pad metal layer 1217 is located on the first contact pad metal layer 1215 and covers the edges of the first contact pad metal layer 1215 to prevent the first contact pad metal layer 1215 from being exposed and corroded by the etching solution in the subsequent patterning process, while the second contact pad metal layer 1217 may form a step to increase the contact area between the first insulation layer 1230 and the second contact pad metal layer 1217, thereby preventing the second contact pad metal layer 1217 from peeling. The height H1 of the first insulation layer 1230 relative to the surface of the base substrate 1000, that is, the vertical distance from the surface of the first insulation layer 1230 to the surface of the base substrate 1000, is not greater than the distance H2 from the surface of the second contact pad metal layer 1217 of the plurality of contact pads 1210 to the surface of the base substrate 1000. Defining the height of the first insulation layer 1230, that is, the thickness of the first insulation layer 1230, may eliminate the poor contact phenomenon in the bonding region and improve the product yield. In addition, the second insulation layer 1250 is arranged between the first contact pad metal layer 1215 and the second contact pad metal layer 1217. And the second insulation layer 1250 covers the edges of the first contact pad metal layer 1215 to prevent the edges of the first contact pad metal layer 1215 from being corroded by the etching solution in the subsequent patterning process.

In at least one example, the second contact pad metal layer 1217 further extends outward on the second insulation layer 1250 than the edges of the first contact pad metal layer 1215 to cover the edges of the first contact pad metal layer 1215, that is, on the surface of the base substrate 1000, the orthographic projection of the second contact pad metal layer 1217 covers the orthographic projection of the first contact pad metal layer 1215. The structure mentioned above may reduce the segment difference at the edges of the plurality of contact pads, and is advantageous for the first insulation layer 1230 to cover the edges of the second contact pad metal layer 1217.

As shown in FIG. 3A, FIG. 3B, and FIG. 3C, the height H1 of the first insulation layer 1230 relative to the surface of the base substrate 1000, that is, the vertical distance between the surface of the first insulation layer 1230 and the surface of the base substrate 1000, is not greater than the distance H2 between the surface of the contact pads 1210 and the surface of the base substrate 1000. It should be noted that, in the example shown in the figures, the surface of the plurality of contact pads 1210 is the surface of the second contact pad metal 1217 farthest from the base substrate 1000. Controlling the height of the first insulation layer 1230, that is, the thickness of the first insulation layer 1230, may eliminate the poor contact phenomenon in the bonding region and improve the product yield.

For example, as shown in FIG. 3A, FIG. 3B, and FIG. 3C, the plurality of leads 1220 of the display substrate 100 are respectively located below the corresponding contact pads 1210. The display substrate 100 further includes a bonding region buffer layer 1241 on the base substrate 1000, and a bonding region first gate insulation layer 1242 on the side of the bonding region buffer layer 1241 away from base substrate 1000. The plurality of leads 1220 are located on the bonding region first gate insulation layer 1242. One end of the plurality of leads 1220 is electrically connected with the plurality of contact pads 1210. For example, the contact pad 1211 in the L1 row, the contact pad 1212 in the L1 row, the contact pad 1213 in the L2 row, and the contact pad 1214 in the L2 row are electrically connected with one of the plurality of leads 1220, respectively, and in the present example, the plurality of leads 1220 are located in the same layer, so the plurality of leads 1220 may be manufactured in the same patterning process.

For example, in other examples, the plurality of leads 1220 may also be located in different layers, for example, the leads configured to connected with the plurality of contact pads 1210 of the L1 row are located in a layer closer to the base substrate, while the leads configured to connected with the plurality of contact pads 1210 of the L2 row are located in a layer relatively further away from the base substrate (but still between the plurality of contact pads of the L2 row and base the substrate). Therefore, the spaces between the plurality of leads 1220 in the same layer are increased, the risk of interference between leads and short circuit is reduced, and the display device with high pixel resolution is advantageous to be formed. Furthermore, the plurality of leads 1220 in the same layer may be manufactured in the same patterning process. For example, the display substrate 100 may further include a bonding region second gate insulation layer 1243 located in the bonding region and a bonding region interlayer insulation layer 1244 located in the bonding region, and the bonding region interlayer insulation layer 1244 is located on a side of at least one lead 1220 away from the base substrate 1000. The plurality of contact pads 1210 is arranged on the bonding region interlayer insulation layer 1244. The bonding region interlayer insulation layer 1244 is located in the bonding region and between the plurality of contact pads 1210 and the first insulation layer 1230, and the base substrate 1000. The bonding region second gate insulation layer 1243 is located between the bonding region first gate insulation layer 1242 and the bonding region interlayer insulation layer 1244 and laminated with the bonding region interlayer insulation layer 1244. The bonding region second gate insulation layer 1243 includes first contact pad via holes 1216, the bonding region interlayer insulation layer 1244 includes second contact pad via holes 1219, and at least one of the plurality of leads 1220 is electrically connected with the contact pad through the first contact pad via holes 1216 and the second contact pad via holes 1219. The plurality of leads 1220 connected with the contact pads 1210 of the L1 row extend through the gaps between the contact pads of the L2 row in the bonding region and then extend to the display region 1100, so that the plurality of contact pads 1210 have larger arrangement spaces and may avoid mutual interference or short circuit with the plurality of leads 1220 connected with the contact pads 1210' of the L2 row.

As shown in FIG. 3C, the bonding region second gate insulation layer 1243 includes a plurality of first contact pad via holes 1216, the bonding region interlayer insulation layer 1244 includes a plurality of second contact pad via holes 1219, and FIG. 3C shows three first contact pad via holes 1216 and three second contact pad via holes 1219 included in the contact pad 1212 and the contact pad 1214 along the sectional line M3-N3. In other examples of the present disclosure, the number of the first contact pad via holes 1216 and the number of the second contact pad via holes 1219 may be multiple, for example, 2 or 4. The present disclosure is not limited to the number of the first contact pad via holes 1216 and the number of the second contact pad via holes 1219.

In other examples, the plurality of leads 1220 may also be located in different layers, for example, the leads configured to connect with the contact pads 1210 of the L1 row are located in a layer closer to the base substrate, while the leads configured to connect with the contact pads 1210 of the L2 row are located in a layer relatively further away from the base substrate (but still between the plurality of contact pads and the base substrate). Therefore, spaces between the plurality of leads 1220 in the same layer are increased, the risk of interference and short circuit between the plurality of leads is reduced, and the display device with high pixel resolution is advantageous to be formed. Moreover, the plurality of leads 1220 in the same layer may be manufactured in the same patterning process. The plurality of leads 1220 in different layers may be manufactured in different patterning processes.

For example, the material of the first insulation layer 1230 may include inorganic insulation materials such as silicon oxide, silicon nitride, silicon oxynitride, etc., or may include organic insulation materials such as polyimide, polyphthalimide, polyphthalamide, acrylic resin, benzocyclobutene, or phenolic resin, etc. The embodiments of the present disclosure do not specifically limit the material of the first insulation layer. The material of the leads may include a metal material or an alloy material, such as a metal single-layer or a multi-layer structure formed by molybdenum, aluminum, titanium, etc. The material of the first contact pad metal layer may include a metal material or an alloy material, such as a metal single-layer or a multi-layer structure formed by molybdenum, aluminum, titanium, etc.

For example, in some embodiments of the present disclosure, each of the plurality of sub-pixels in the pixel array of the display region of the display substrate includes a pixel drive circuit, a first planarization layer, a first transfer electrode, a second planarization layer, and a light emitting element. The first planarization layer is located on a side of the pixel drive circuit away from the base substrate to provide a first planarization surface and includes a first via hole, the first transfer electrode is on the first planarization surface and is electrically connected with the pixel drive circuit through the first via hole, the second planarization layer is located on a side of the first transfer electrode away from the base substrate to provide a second planarization surface and includes a second via hole, the light emitting element is on the second planarization surface and is electrically connected with the first transfer electrode through the second via hole, and the first insulation layer and the second planarization layer are provided at a same layer.

For example, the pixel drive circuit may include a thin film transistor, a storage capacitor, etc., may be implemented in various types, such as a 2T1C type (that is, including two thin film transistors and one storage capacitor), and may further include more transistors and/or capacitors based on the 2T1C type to have functions of compensation, reset, light emitting control, detection, etc. The embodiments of the present disclosure do not limit the type of the pixel drive circuit. For example, in some embodiments, the thin film transistor directly and electrically connected to the light emitting element may be a drive transistor, or a light emitting control transistor, etc.

In the embodiments of the present disclosure, "provided at a same layer" means that two functional layers (for example, the first insulation layer and the second planarization layer) are in the same layer and formed by the same material in the hierarchical structure of the display substrate, that is, in the manufacturing process, the two functional layers may be formed by the same material layer, and the required patterns and structures may be formed by the same patterning process. For example, after the material layer is formed at first, the two functional layers may be formed by the material layer through a patterning process.

Figure 4:
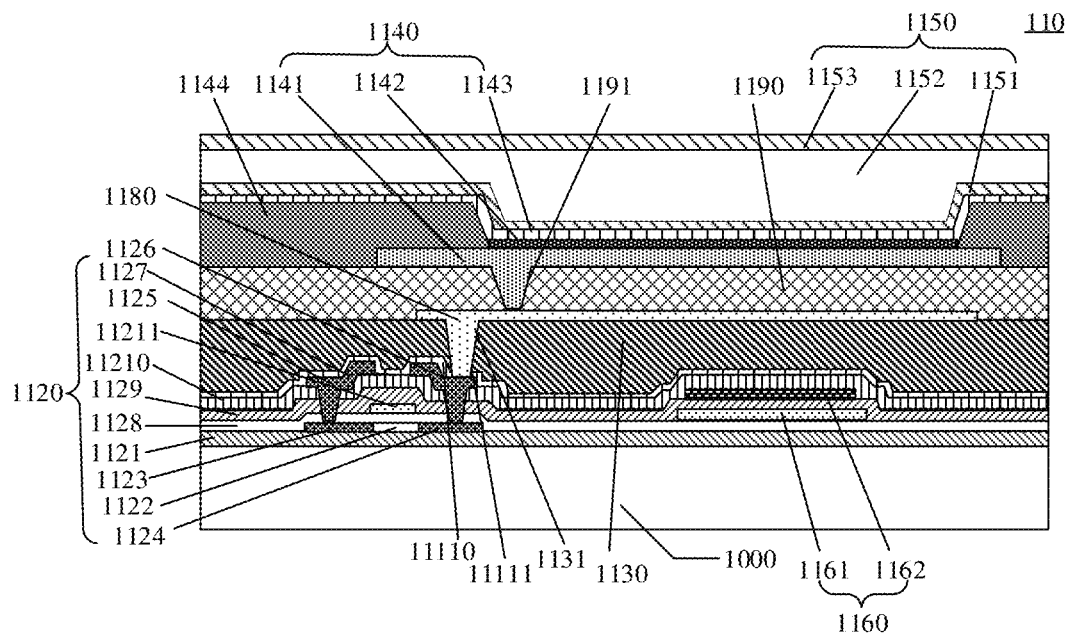
FIG. 4 is a schematic cross-sectional view of a display region of the display substrate as shown in FIG. 2B.

For example, in some embodiments of the present disclosure, FIG. 4 is a schematic cross-sectional diagram of the display region of the display substrate as shown in FIG. 2B. The plurality of sub-pixels 110 in each pixel unit in the pixel array of the display region of the display substrate are configured to realize light emitting drive and light emitting control. One of the plurality of sub-pixels 110 includes a pixel drive circuit 1120, a first planarization layer 1130, a first transfer electrode 1180, a second planarization layer 1190, and a light emitting element 1140.

For example, the one of the plurality of sub-pixels further includes a buffer layer 1121 on the base substrate 1000, and the pixel drive circuit 1120 includes an active layer 1122 on the display region buffer layer 1121, a display region first gate insulation layer 1128 on the side of the active layer 1122 away from the substrate 1000, a gate electrode 11211 on the display region first gate insulation layer 1128, a display region second gate insulation layer 1129 located on the side of the gate electrode 11211 away from the base substrate 1000, a display region interlayer insulation layer 11210 located on the display region second gate insulation layer 1129, and a source electrode 1125 and a drain electrode 1126 that are located on the display region interlayer insulation layer 11210. The gate electrode 11211 may be provided at the same layer as the plurality of leads 1220 in the bonding region 1200. Therefore, the gate electrode 11211 and the plurality of leads 1220 may be formed at the same layer in the manufacturing process, for example, the gate electrode 11211 and the plurality of leads 1220 may be formed by a patterning process by using the same material layer. The display region buffer layer 1121 in the display region is provided at the same layer as the bonding region buffer layer 1241 in the bonding region, and the display region buffer layer 1121 and the bonding region buffer layer 1241 may be formed at the same layer in the manufacturing process. The display region first gate insulation layer 1128 in the display region is provided at the same layer as the bonding region first gate insulation layer 1242 in the bonding region, the display region second gate insulation layer 1129 in the display region is provided at the same layer as the bonding region second gate insulation layer 1243 in the bonding region, and the display region interlayer insulation layer 11211 in the display region is provided at the same layer as the bonding region interlayer insulation layer 1244. The display region buffer layer 1121 serves as a transition layer, which can not only prevent harmful substances in the base substrate from invading the interior of the display substrate, but also increase the adhesion of the film layer in the display substrate to the base substrate 1000.

For example, the material of the display region buffer layer 1121 may include insulation materials such as silicon oxide, silicon nitride, silicon oxynitride, etc. Materials of one of the display region interlayer insulation layer 11210, the display region second gate insulation layer 1129, and the display region first gate insulation layer 1128, or materials of more than one of the display region interlayer insulation layer 11210, the display region second gate insulation layer 1129, and the display region first gate insulation layer 1128, may include insulation materials such as silicon oxide, silicon nitride, silicon oxynitride, etc. The materials of the display region interlayer insulation layer 11210, the display region second gate insulation layer 1129, and the display region first gate insulation layer 1128 may be the same or different.

For example, in some example of that above embodiments of the present disclosure, as shown in FIG. 4, the active layer 1122 may include a source region 1123 and a drain region 1124, and a channel region located between the source region 1123 and the drain region 1124. The display region interlayer insulation layer 11210, the display region second gate insulation layer 1129, and the display region first gate insulation layer 1128 have via holes to expose the source region 1123 and the drain region 1124. The source electrode 1125 and the drain electrode 1126 are electrically connected with the source region 1123 and the drain region 1124 through the via holes, respectively. The gate electrode 11211 is overlapped with the channel region located between the source region 1123 and the drain region 1124 in the active layer 1122 in a direction perpendicular to the base substrate 1000. The first planarization layer 1130 is located above the source electrode 1125 and the drain electrode 1126, and is configured to planarize the surface of the side of the pixel drive circuit away from the base substrate. A first via hole 1131 is formed in the first planarization layer 1130 to expose the source electrode 1125 or the drain electrode 1126 (the case as shown in FIG. 4). A passivation layer 11110 is formed between the pixel drive circuit 1120 and the first planarization layer 1130 and includes a passivation layer via hole 11111. The passivation layer can protect the source electrode and the drain electrode of the pixel drive circuit from being corroded by water vapor. The first transfer electrode 1180 is formed on the first planarization layer 1130. The first transfer electrode 1180 is electrically connected with the drain electrode 1126 through the first via hole 1131 and the passivation layer via hole 11111. The first transfer electrode can avoid directly forming through via holes with relatively large apertures in the first planarization layer and the second planarization layer, thereby improving the quality of electrical connection of the via holes. In addition, the first transfer electrode may also be formed in the same layer as other signal lines (for example, power lines, etc.), thus not causing an increase in the steps of manufacturing process. The first transfer electrode 1180 and the second contact pad metal layer 1217 of the plurality of contact pads 1210 are provided at the same layer, so the first transfer electrode 1180 and the second contact pad metal layer 1217 may be formed at the same layer in the manufacturing process, for example, the first transfer electrode 1180 and the second contact pad metal layer 1217 may be formed by a patterning process by using the same material layer, thereby simplifying the manufacturing process.

For example, the material of the first transfer electrode 1180 may include a metal material or an alloy material, such as a metal single-layer or a multi-layer structure formed by molybdenum, aluminum, titanium, etc.

For example, the material of the active layer 1122 may include polysilicon or an oxide semiconductor (for example, indium gallium zinc oxide). The material of the gate electrode 11211 may include a metal material or an alloy material, such as a metal single-layer or a multi-layer structure formed by molybdenum, aluminum, titanium, etc., for example, the multi-layer structure is a multi-metal laminated layer (such as a three-layer metal laminated layer of titanium, aluminum, and titanium (Ti/Al/Ti). The material of the source electrode 1125 and the drain electrode 1126 may include a metal material or an alloy material, for example, a metal single-layer or a multi-layer structure formed by molybdenum, aluminum, titanium, etc., for example, the multi-layer structure is a multi-metal laminated layer (for example, a three-layer metal laminated layer of titanium, aluminum, and titanium (Ti/Al/Ti)). The embodiments of the present disclosure do not specifically limit the material of each functional layer.

For example, the material of the passivation layer may include an organic insulation material or an inorganic insulation material, such as silicon nitride material, which can well protect the pixel drive circuit from being corroded by the water vapor due to its high dielectric constant and good hydrophobic function.

For example, in some examples of the present disclosure, as shown in FIG. 4, the pixel drive circuit 1120 may further include a first display metal layer 1127 provided at the same layer as the first contact pad metal layer 1215. The first display metal layer 1127 includes the source electrode 1125 and the drain electrode 1126 of the above-mentioned thin film transistor of the pixel driving circuit. The source electrode 1125 and the drain electrode 1126 are provided at the same layer as the first contact pad metal layer 1215. Therefore, the source electrode 1125 and the drain electrode 1126, and the first contact pad metal layer 1215 may be formed at the same layer in the manufacturing process, for example, by a patterning process by using the same material layer, thereby simplifying the manufacturing process and reducing the manufacturing cost of the product.

For example, in some examples of the present disclosure, as shown in FIG. 4, the second planarization layer 1190 is arranged on the side of the first transfer electrode 1180 away from the base substrate 1000 to provide a planarization surface on the side of the first transfer electrode 1180 away from the substrate 1000. Furthermore, a second via hole 1191 is formed in the second planarization layer 1190. The second planarization layer 1190 is formed at the same layer as the first insulation layer 1230 in the bonding region 1200, so that the second planarization layer 1190 and the first insulation layer 1230 may be formed at the same layer in the manufacturing process, for example, the second planarization layer 1190 and the first insulation layer 1230 may be formed by a patterning process by using the same material layer, thereby simplifying the manufacturing process.

For example, the light emitting element 1140 is formed on the second planarization layer, that is, the light emitting element 1140 is arranged on the side of the second planarization layer 1190 away from the base substrate. The light emitting element 1140 includes a first electrode 1141, a light emitting layer 1142, and a second electrode 1143. The first electrode 1141 of the light emitting element is electrically connected with the first transfer electrode 1180 through the second via hole 1191 in the second planarization layer 1140. A pixel defining layer 1144 is formed on the first electrode 1141, and the pixel defining layer 1144 includes a plurality of openings to define a plurality of pixel units. Each of the plurality of openings exposes a corresponding first electrode 1141. In addition, the light emitting layer 1142 is arranged in the plurality of openings of the pixel defining layer 1144, and the second electrode 1143 is arranged on the pixel defining layer 1144 and the light emitting layer 1142. For example, the second electrode 1143 may be arranged in a portion or an entire of the display region, so that the second electrode 1143 is formed to a whole surface in the manufacturing process.

For example, the material of the second planarization layer 1190 may include inorganic insulation materials such as silicon oxide, silicon nitride, and silicon oxynitride, etc., and may further include organic insulation materials such as polyimide, polyphthalimide, polyphthalamide, acrylic resin, benzocyclobutene, or phenolic resin, etc., and the embodiments of the present disclosure are not limited thereto.

For example, the first electrode 1141 may include a reflective layer, and the second electrode 1143 may include a transparent layer or a translucent layer. Thus, the first electrode 1141 may reflect light emitted from the light emitting layer 1142, and the part of light is emitted into the external environment through the second electrode 1143, so that light emission rate may be provided. In the case where the second electrode 1143 includes a semi-transmissive layer, some light reflected by the first electrode 1141 is reflected again by the second electrode 1143, so that the first electrode 1141 and the second electrode 1143 form a resonant structure, thereby improving light emission efficiency.

For example, the material of the first electrode 1141 may include at least one transparent conductive oxide material, which includes indium tin oxide (ITO), indium zinc oxide (IZO), zinc oxide (ZnO), etc. In addition, the first electrode 1141 may adopt a metal having high reflectivity as a reflective layer, such as silver (Ag).

For example, for OLED, the light emitting layer 1142 may adopt a small molecular organic material or a polymer molecular organic material, which may be a fluorescent light emitting material or a phosphorescent light emitting material, and may emit red light, green light, blue light, or white light. In addition, the light emitting layer may further include functional layers such as an electron injection layer, an electron transport layer, a hole injection layer, a hole transport layer, and the like as required. For QLED, the light emitting layer may adopt a quantum dot material, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc., and the particle size of the quantum dots is 2-20 nm.

For example, the second electrode 1143 may adopt various conductive materials. For example, the second electrode 1143 may adopt a metal material such as lithium (Li), aluminum (Al), magnesium (Mg), silver (Ag), etc.

For example, the material of the pixel defining layer 1144 may include organic insulation materials such as polyimide, polyphthalimide, polyphthalamide, acrylic resin, benzocyclobutene or phenolic resin, etc., or inorganic insulation materials such as silicon oxide, silicon nitride, etc., and the embodiments of the present disclosure are not limited thereto.

In addition, the display substrate further includes a storage capacitor 1160, which may include a first capacitance electrode 1161 and a second capacitance electrode 1162. The first capacitor electrode 1161 is arranged between the display region first gate insulation layer 1128 and the display region second gate insulation layer 1129, and the second capacitor electrode 1162 is arranged between the display region second gate insulation layer 1129 and the display region interlayer insulation layer 11210. The first capacitance electrode 1161 and the second capacitance electrode 1162 are stacked, and are at least partially overlapped with each other in the direction perpendicular to the base substrate 1000. The first capacitor electrode 1161 and the second capacitor electrode 1162 adopt the display region second gate insulation layer 1129 of as a dielectric material to form the storage capacitor. The first storage capacitor electrode 1161 is provided at the same layer as the gate electrode 11211 in the pixel drive circuit 1120 and the plurality of leads 1220 in the bonding region 1200. Similarly, as described above, in the variation of the above example, the first capacitance electrode and the second capacitance electrode of the storage capacitor 1160 may also be located in other layers, thereby obtaining sub-pixels of different structures.

In another example, as a variation of the example shown in FIG. 4, the first capacitance electrode of the storage capacitor is still provided at the same layer as the gate electrode 11211, while the second capacitance electrode of the storage capacitor is provided at the same layer as the source electrode 1125 and the drain electrode 1126 of the thin film transistor (that is, also located in the first display metal layer 1127), whereby the first capacitance electrode and the second capacitance electrode adopt a stack of the display region second gate insulation layer 1129 and the display region interlayer insulation layer 11210 as dielectric materials to form the storage capacitor.

In still another example, as a variation of the example shown in FIG. 4, the first capacitance electrode of the storage capacitor is no longer provided at the same layer as the gate electrode 11211, but is located between the display region second gate insulation layer 1129 and the display region interlayer insulation layer 11210, while the second capacitance electrode of the storage capacitor is provided at the same layer as the source electrode 1125 and the drain electrode 1126 of the thin film transistor (that is, is also located in the first display metal layer 1127), whereby the first capacitance electrode and the second capacitance electrode adopt the display region interlayer insulation layer 11210 as a dielectric material to form the storage capacitor.

For example, in some examples of the present disclosure, as shown in FIG. 4, the display substrate may further include an encapsulation layer 1150 arranged on the light emitting element 1140. The encapsulation layer 1150 seals the light emitting element 1140, so that degradation of the light emitting element 1140 caused by moisture and/or oxygen included in the environment may be reduced or avoided. The encapsulation layer 1150 may be a single-layer structure or a composite layer structure, and the composite layer structure includes a structure in which inorganic layers and organic layers are stacked. For example, the encapsulation layer 1150 may include a first inorganic encapsulation layer 1151, a first organic encapsulation layer 1152, and a second inorganic encapsulation layer 1153 which are sequentially arranged. The encapsulation layer 1150 may extend to the bonding region, and in the above example, the encapsulation layer does not cover the plurality of contact pads.

For example, the material of the encapsulation layer may include insulation materials such as silicon nitride, silicon oxide, silicon oxynitride, polymer resin, etc. Inorganic materials such as silicon nitride, silicon oxide, and silicon oxynitride have high compactness and can prevent invasion of water, oxygen, etc. The material of the organic encapsulation layer may be a polymer material containing a desiccant or a polymer material configured to block water vapor, for example, a polymer resin or the like to planarize the surface of the display substrate, and to relieve the stress of the first inorganic encapsulation layer and the second inorganic encapsulation layer. The material of the organic encapsulation layer may further include a water absorbent material such as a desiccant to absorb substances such as water and oxygen invading the interior of the display substrate.

Figure 5A:
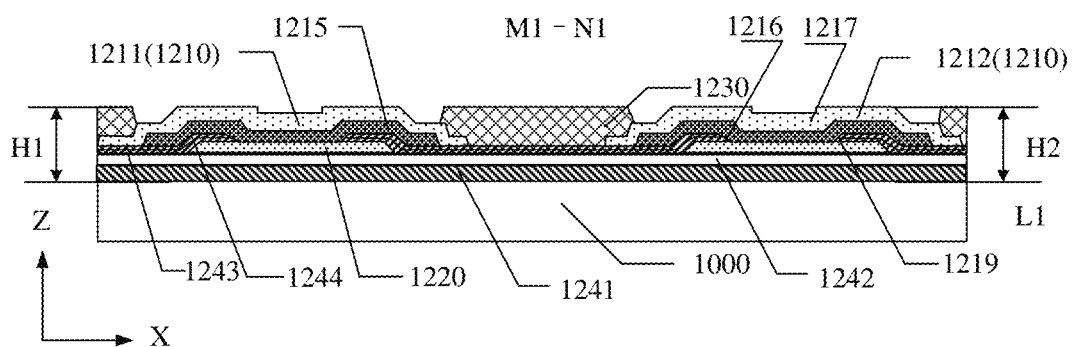
FIG. 5A is a schematic cross-sectional view taken along line M1-N1 of the display substrate as shown in FIG. 2B according to another embodiment of the present disclosure.

For example, in some examples of the present disclosure, FIG. 5A is a schematic cross-sectional view taken along line M1-N1 of the display substrate as shown in FIG. 2B according to another embodiment of the present disclosure.

Compared with the structure of the bonding region as shown in FIG. 3A, the structure of the bonding region shown in FIG. 5A removes the second insulation layer 1250 in the bonding region 1200 of the display substrate. The second contact pad metal layer 1217 directly covers the edges of the first contact metal layer 1215, which may reduce the thickness of the film layer of the plurality of contact pads 1210 and further reduce the segment difference of the film layer, thereby further eliminating the poor contact phenomenon in the bonding region.

Figure 5B:
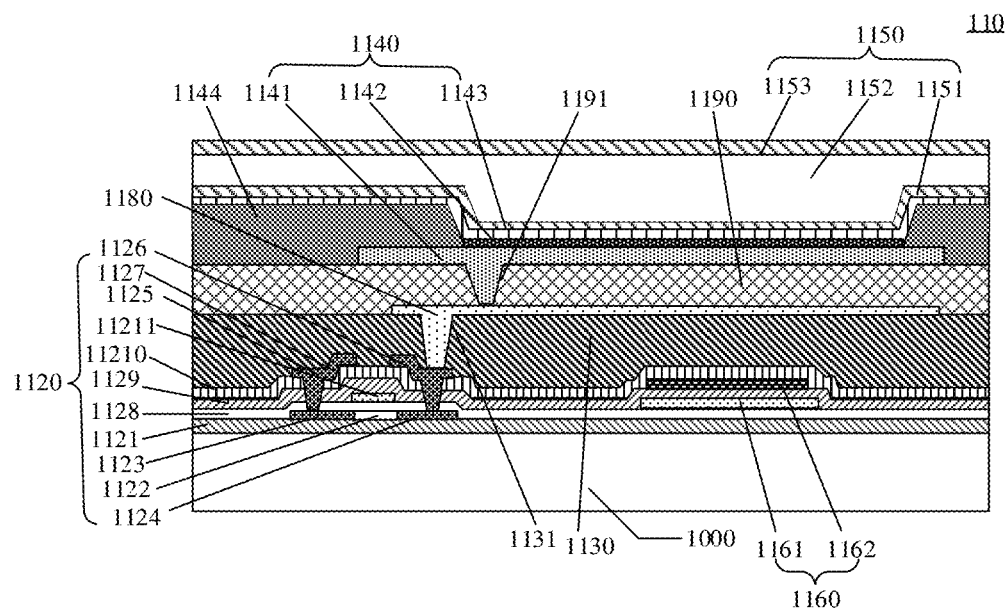
FIG. 5B is a schematic cross-sectional view of the display region of the display substrate as shown in FIG. 2B according to another embodiment of the present disclosure.

For example, in some examples of the present disclosure, FIG. 5B is a schematic cross-sectional view of the display region of the display substrate as shown in FIG. 2B according to another embodiment of the present disclosure.

Compared with the structure of the display substrate as shown in FIG. 4, the structure of the display substrate shown in FIG. 5B removes the passivation layer 11110 in the plurality of sub-pixels (110) in the display region of the display substrate.

For example, in some examples of the present disclosure, the display substrate further includes a bonding region third insulation layer located in the bonding region, and is arranged on a side of the first insulation layer and the plurality of contact pads away from the base substrate to cover the first insulation layer and the plurality of contact pads, and the bonding region third insulation layer includes third contact pad via holes to expose the surface of the plurality of contact pads.

For example, in some examples of the present disclosure, the display substrate further includes an auxiliary conductive layer. The auxiliary conductive layer is located in the bonding region and is arranged on a side of the bonding region third insulation layer away from the base substrate, the auxiliary conductive layer includes a second transfer electrode pattern located in the bonding region, and the second transfer electrode pattern is electrically connected with the plurality of contact pads through the third contact pad via holes.

Figure 6:
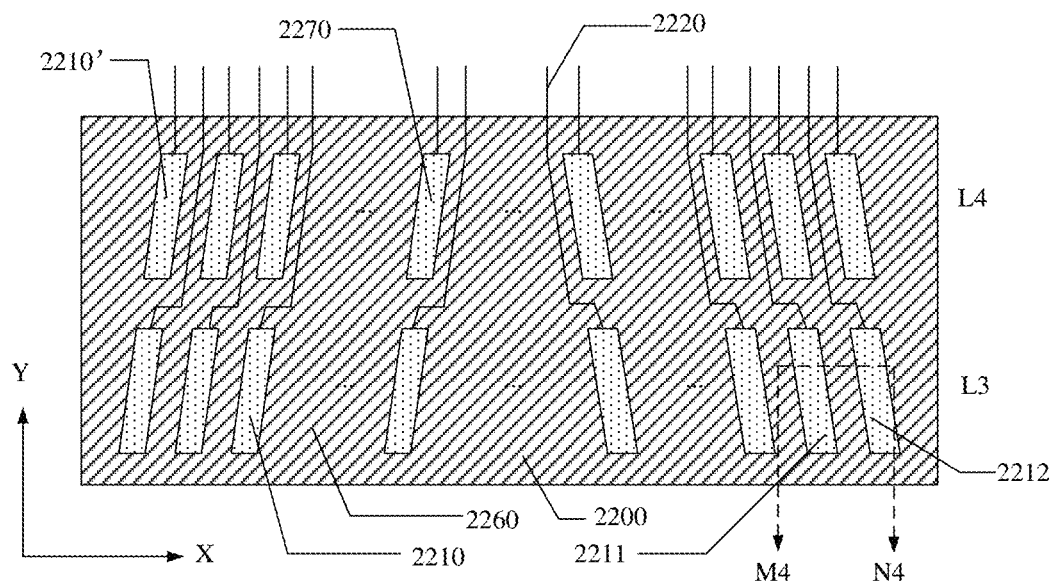
FIG. 6 is a schematic plan view of a bonding region of another display substrate according to an embodiment of the present disclosure.
Figure 7A:
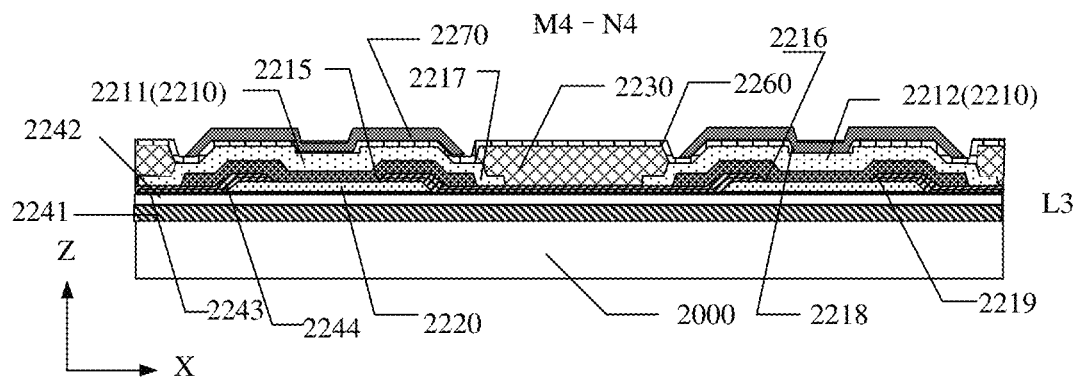
FIG. 7A is a schematic cross-sectional view taken along line M4-N4 of the display substrate as shown in FIG. 6 according to an embodiment of the present disclosure.

For example, FIG. 6 is a schematic plan view of a bonding region of another display substrate according to an embodiment of the present disclosure. FIG. 7A is a schematic cross-sectional view taken along line M4-N4 of the display substrate as shown in FIG. 6 according to an embodiment of the present disclosure.

For example, the display substrate includes a base substrate 2000. The base substrate 2000 includes a display region and a peripheral region surrounding the display region, and the peripheral region includes at least one bonding region. Similarly, the display region includes a pixel array and scanning lines (gate lines), data lines, power lines, detection lines, etc., which are configured to provide control signals, data signals, voltage signals, etc., to the pixel array.

As shown in FIG. 6 and FIG. 7A, the display substrate may further include a plurality of leads 2220 and at least one group of contact pads. At least one group of contact pads include a plurality of contact pads 2210. The plurality of contact pads may further be divided into a first group of contact pads 2210 and a second group of contact pads 2210'. The second group of contact pads 2210' are located at one side of the first group of contact pads 2210 close to the display region 1100. The display substrate further includes a bonding region buffer layer 2241 on the base substrate 2000, and a bonding region first gate insulation layer 2242 on the side of the bonding region buffer layer 2241 away from the base substrate 2000. The plurality of leads 2220 is located on the bonding region first gate insulation layer 2242. The plurality of leads 2220 are electrically connected with the plurality of contact pads 2210 in one-to-one correspondence. One end of the plurality of leads 2220 extends to the display region and is electrically connected with signal lines (for example, data lines) in the display region, and the other end of the plurality of leads 2210 extends to the bonding region 2200 and is electrically connected with the plurality of contact pads 2210. The plurality of contact pads 2210 are arranged in a single row or multiple rows, for example, in the example shown in the FIG. 6, the plurality of contact pads are arranged in, for example, two rows, which are named as a L3 row (first row) and a L4 row (second row), and the L4 row is located between the L3 row and the display region. Intervals are arranged between the plurality of contact pads 2210 in the same row, and intervals are arranged between the plurality of contact pads 2210 in different rows, and the sectional line M4-N4 passes through a contact pad 2211 in the L3 row and a contact pad 2212 in the L3 row.

Similarly, in other examples, the plurality of leads 2220 may also be located in different layers, for example, the leads configured to connected with the contact pads 2210 of the L3 row are located in a layer closer to the base substrate, while the leads configured to connected with the contact pads 2210 of the L4 row are located in a layer relatively further away from the base substrate (but still between the contact pads and base the substrate). Therefore, the spaces between the plurality of leads 2220 in the same layer are increased, the risk of interference between leads and short circuit is reduced, and the display device with high pixel resolution is advantageous to be formed. Furthermore, the plurality of leads 2220 in the same layer may be manufactured in the same patterning process.

The display substrate may further include a first insulation layer 2230 and a bonding region third insulation layer 2260. The first insulation layer 2230 covers at least part of edges of the plurality of contact pads 2210. The plurality of contact pads 2210 include at least one contact pad metal layer, for example, include a plurality of contact pad metal layers. In the example as shown in FIG. 7A, the at least one contact pad metal layer of the plurality of contact pads 2210 may include a first contact pad metal layer 2215 and a second contact pad metal layer 2217, and the second contact pad metal layer 2217 is laminated on a side of the first contact pad metal layer 2215 away from the base substrate 2000. The bonding region third insulation layer 2260 covers the first insulation layer 2230 and the plurality of contact pads 2210, so that in the manufacturing process of the display substrate, the first insulation layer may protect the edges of the plurality of contact pads and prevent the etching solution from etching the edges of the contact pads that are exposed, thereby improving the product yield and reliability of the display substrate.

For example, as shown in FIG. 7A, the display substrate may further include a bonding region second gate insulation layer 2243 and a bonding region interlayer insulation layer 2244 located in the bonding region. The bonding region interlayer insulation layer 2244 is located in the bonding region, and is located between the plurality of contact pads 2210 and the first insulation layer 2230, and the base substrate 2000. The bonding region second gate insulation layer 2243 is located between the bonding region first gate insulation layer 2242 and the bonding region interlayer insulation layer 2244, and is laminated with the bonding region interlayer insulation layer 2244. The bonding region second gate insulation layer 2243 includes first contact pad via holes 2216, the bonding region interlayer insulation layer 2244 includes second contact pad via holes 2219, and at least one of the plurality of leads 2220 is electrically connected with the contact pad via holes through the first contact pad via holes 2216 and the second contact pad via holes 2219. The leads 2220 connecting with the contact pads 2210 of the L3 row extends through the gaps between the contact pads of the L4 row in the bonding region and then extends to the display region, so that the plurality of contact pads 2210 have larger arrangement spaces and may avoid mutual interference or short circuit with the plurality of leads 2220 connecting with the contact pads 2210 of the L3 row.

For example, as shown in FIG. 7A, the second contact pad metal layer 2217 is formed on the first contact pad metal layer 2215 and covers the edges of the first contact pad metal layer 2215 to prevent the first contact pad metal layer 2215 from being exposed and corroded by the etching solution in a subsequent patterning process. The first insulation layer 2230 covers at least part of the edges of the second contact pad metal layer 2217 of the plurality of contact pads 2210. The height of the first insulation layer 2230 relative to the surface of the base substrate 2000, that is, the vertical distance between the surface of the first insulation layer 2230 and the surface of the base substrate 2000, is not greater than the distance between the surface of the second contact pad metal layer 2217 of the plurality of contact pads 2210 and the surface of the base substrate 2000. Limiting the height of the first insulation layer 2230, that is, the thickness of the first insulation layer 2230, may eliminate the poor contact phenomenon in the bonding region and improve the product yield. In addition, the second contact pad metal layer 2217 directly covers the edges of the first contact metal layer 2215, which may reduce the thickness of the film layer of the plurality of contact pads 2210 and further reduce the segment difference of the film layer, thereby further eliminating the poor contact phenomenon in the bonding region.

For example, as shown in FIG. 7A, the display substrate may further include an auxiliary conductive layer. The auxiliary conductive layer is located in the bonding region and is arranged on the bonding region third insulation layer 2260. The auxiliary conductive layer includes a second transfer electrode pattern 2270 located in the bonding region. The second transfer electrode pattern 2270 is implemented to perform a bonding process with an external circuit. Third contact pad via holes 2218 is formed in the bonding region third insulation layer 2260. The second transfer electrode pattern 2270 is electrically connected with the plurality of contact pads through the third contact pad via holes 2218 to transmit electrical signals. The first insulation layer 2230 is configured to expose a surface of plurality of the contact pad 2210 away from the base substrate 2000. That is, a region, which is not covered by the plurality of contact pads 2210, in the bonding region 2200 is covered by the first insulation layer 2230, and the region includes but is not limited to gaps between the plurality of contact pads of the same row and gaps between the plurality of contact pads of different rows.

For example, in some examples of the present disclosure, the height of the second transfer electrode pattern 2270 relative to the surface of the base substrate 2000 is not greater than the height of the bonding region third insulation layer 2260 relative to the surface of the base substrate 2000 to avoid poor contact phenomenon of the bonding region.

Figure 7B:
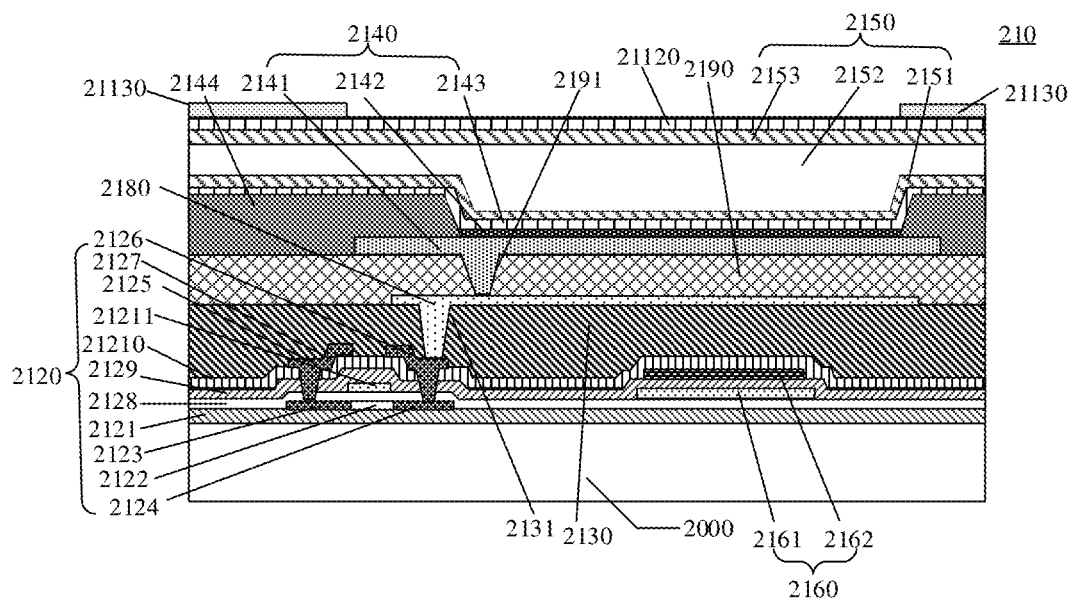
FIG. 7B is a schematic cross-sectional view of a display region of the display substrate as shown in FIG. 6 according to an embodiment of the present disclosure.

For example, in some examples of the present disclosure, FIG. 7B is a schematic cross-sectional view of the display region of the display substrate as shown in FIG. 6 according to an embodiment of the present disclosure. As shown in FIG. 7B, each of the plurality of sub-pixels 210 in each pixel unit in the pixel array of the display region of the display substrate may include a pixel drive circuit 2120, a first planarization layer 2130, a first transfer electrode 2180, a second planarization layer 2190, and a light emitting element 2140.

For example, the one of the plurality of sub-pixels further includes a buffer layer 2121 on the base substrate 2000, and the pixel drive circuit 2120 includes an active layer 2122 on the display region buffer layer 2121, a display region first gate insulation layer 2128 on the side of the active layer 2122 away from the substrate 2000, a gate electrode 21211 on the display region first gate insulation layer 2128, a display region second gate insulation layer 2129 located on the side of the gate electrode 21211 away from the base substrate 2000, the display region interlayer insulation layer 21210 located on the display region second gate insulation layer 2129, and the source electrode 2125 and drain electrode 2126 located on the display region interlayer insulation layer 21210. The gate electrode 21211 may be provided at the same layer as the plurality of leads 2220 in the bonding region 2200. The display region buffer layer 2121 in the display region is provided at the same layer as the bonding region buffer layer 2241 in the bonding region. The display region buffer layer 2121 and the bonding region buffer layer 2241 may be formed at the same layer in the manufacturing process. The display region first gate insulation layer 2128 in the display region is provided at the same layer as the bonding region first gate insulation layer 2242 in the bonding region, the display region second gate insulation layer 2129 in the display region is provided at the same layer as the bonding region second gate insulation layer 2243, and the display region interlayer insulation layer 21210 in the display region is provided at the same layer as the bonding region interlayer insulation layer 2244. The display region buffer layer 2121 serves as a transition layer, which can not only prevent harmful substances in the base substrate from invading the interior of the display substrate, but also increase the adhesion of the film layer in the display substrate to the base substrate 2000.

For example, in some examples of the present disclosure, as shown FIG. 7B, the active layer 2122 includes a source region 2123 and a drain region 2124, and a channel region located between the source region 2123 and the drain region 2124. The display region interlayer insulation layer 21210, the display region second gate insulation layer 2129, and the display region first gate insulation layer 2128 have via holes to expose the source region 2123 and the drain region 2124. The source electrode 2125 and the drain electrode 2126 are electrically connected with the source region 2123 and the drain region 2124 through the via holes, respectively. The gate electrode 21211 is overlapped with the channel region located between the source region 2123 and the drain region 2124 in the active layer 2122 in the direction perpendicular to the base substrate 2000. The first planarization layer 2130 is located above the source electrode 2125 and the drain electrode 2126, and a first via hole 2131 is formed in the first planarization layer 2130 to expose the source electrode 2125 or the drain electrode 2126 (the case as shown in FIG. 7B). The first transfer electrode 2180 is formed on the first planarization layer 2130. The first transfer electrode 2180 is electrically connected with the drain electrode 2126 through the first via hole 2131. The first transfer electrode can avoid directly forming through via holes with relatively large apertures in the first planarization layer and the second planarization layer, thereby improving the quality of electrical connection of the via holes. In addition, the first transfer electrode may also be formed in the same layer as other signal lines (for example, power lines, etc.), thus not causing an increase in the steps of manufacturing process. The first transfer electrode 2180 and the second contact pad metal layer 2217 are provided at the same layer, For example, in some examples of the present disclosure, as shown in FIG. 7B, the pixel drive circuit 2120 may further include a first display metal layer 2127 provided at the same layer as the first contact pad metal layer 2215. The first display metal layer 2127 includes the source electrode 2125 and the drain electrode 2126 of the above-mentioned thin film transistor in the pixel driving circuit. The source electrode 2125 and the drain electrode 2126 are provided at the same layer as the first contact pad metal layer 2215. Therefore, the source electrode 2125 and the drain electrode 2126, and the first contact pad metal layer 2215 may be formed at the same layer in the manufacturing process, for example, by a patterning process by using the same material layer, thereby simplifying the manufacturing process and reducing the manufacturing cost of the product.

For example, in some examples of the present disclosure, as shown in FIG. 7B, the second planarization layer 2190 is arranged on the side of the first transfer electrode 2180 away from the base substrate 2000 to provide a planarization surface on the side of the first transfer electrode 2180 away from the substrate 2000. Furthermore, a second via hole 2191 is formed in the second planarization layer 2190. The second planarization layer 2190 is formed at the same layer as the first insulation layer 2230 in the bonding region 2200. The light emitting element 2140 is formed on the second planarization layer 2190, that is, the light emitting element 2140 is arranged on the side of the second planarization layer 2190 away from the bases substrate. The light emitting element 2140 includes a first electrode 2141, a light emitting layer 2142, and a second electrode 2143. A pixel defining layer 2144 is formed on the first electrode 2141, and the pixel defining layer 2144 includes a plurality of openings to define a plurality of pixel units. Each of the plurality of openings exposes a corresponding first electrode 2141, and the light emitting layer 2142 is arranged in the plurality of openings of the pixel defining layer 2144. For example, the second electrode 2143 may be arranged in a portion or an entire of the display region, so that the second electrode 2143 is formed to a whole surface in the manufacturing process. The first electrode 2141 of the light emitting element is electrically connected with the first transfer electrode 2180 through the second via hole 2191 in the second planarization layer 2140.

For example, the display substrate further includes a storage capacitor 2160, which may include a first capacitance electrode 2161 and a second capacitance electrode 2162. The first capacitor electrode 2161 is arranged between the display region first gate insulation layer 2128 and the display region second gate insulation layer 2129, and the second capacitor electrode 2162 is arranged between the display region second gate insulation layer 2129 and the display region interlayer insulation layer 21210. The first capacitance electrode 2161 and the second capacitance electrode 2162 are stacked, and are at least partially overlapped with each other in the direction perpendicular to the base substrate 2000. The first capacitor electrode 2161 and the second capacitor electrode 2162 adopt the display region second gate insulation layer 2129 as a dielectric material to form the storage capacitor. The first storage capacitor electrode 2161 is provided at the same layer as the gate electrode 21211 in the pixel drive circuit 2120 and the plurality of leads 2220 in the bonding region 2200. Similarly, as described above, in the variation of the above example, the first capacitance electrode and the second capacitance electrode of the storage capacitor 2160 may also be located in other layers, thereby obtaining sub-pixels of different structures.

For example, in some examples of the present disclosure, as shown in FIG. 7B, the display substrate may further include an encapsulation layer 2150 arranged on the light emitting element 2140. The encapsulation layer 2150 seals the light emitting element 2140, so that degradation of the light emitting element 2140 caused by moisture and/or oxygen included in the environment may be reduced or avoided. The encapsulation layer 2150 may be a single-layer structure or a composite layer structure, and the composite layer structure includes a structure in which inorganic layers and organic layers are stacked. For example, the encapsulation layer 2150 may include a first inorganic encapsulation layer 2151, a first organic encapsulation layer 2152, and a second encapsulation layer 2153 which are sequentially arranged. The encapsulation layer 2150 may extend to the bonding region, and in the above example, the encapsulation layer does not cover the plurality of contact pads.

For example, in some examples of the present disclosure, as shown in FIG. 7B, the display substrate further includes a display region third insulation layer 21120 located in the display region. The display region third insulation layer 21120 is arranged on the encapsulation layer 2150 to cover the encapsulation layer 2150. The display region third insulation layer 21120 is provided at the same layer as the bonding region third insulation layer 2260. The display substrate may further include an auxiliary electrode layer 21130 located in the display region. The auxiliary electrode layer 21130 is arranged on the display region third insulation layer 21120, and the auxiliary electrode layer 21130 can be used for other auxiliary functions, such as a touch function. The auxiliary electrode layer 21130 has an opening in a region of one of the plurality of sub-pixels. The material of the display region third insulation layer 21120 may include organic insulation materials such as polyimide, polyphthalimide, polyphthalamide, acrylic resin, benzocyclobutene or phenolic resin, etc., or inorganic insulation materials such as silicon oxide, silicon nitride, etc., and the embodiments of the present disclosure are not limited thereto.

For example, the auxiliary electrode layer for realizing the touch function may be used to realize a capacitive touch structure, which is of a self-capacitance type or a mutual capacitance type. The touch structure of the self-capacitance type includes a plurality of self-capacitance electrodes arranged in an array (at the same layer), and each of the plurality of self-capacitance electrodes is electrically connected with a touch processing circuit (such as a touch chip) through a touch lead. Position detection is realized by detecting a capacitance change of the plurality of capacitance electrodes due to, for example, finger proximity during touch. The touch structure of the mutual capacitance type includes a plurality of first touch signal lines extending in a first direction and a plurality of second touch signal lines extending in a second direction, and the plurality of first touch signal lines and the plurality of second touch control signal lines are electrically connected with a touch processing circuit (such as a touch chip) through touch leads. The first direction and the second direction cross each other and form an opening, thereby forming a touch capacitance at one of crossing positions of the plurality of first touch signal lines and the plurality of the second touch signal lines, and realizing position detection by detecting a capacitance change in the touch capacitance due to, for example, finger proximity during touch. The embodiments of the present disclosure are illustrated by taking the touch structure of the mutual capacitance type as an example.

As shown in the figure, the touch structure of the mutual capacitance type includes excitation electrodes and induction electrodes which are mutually crossed and arranged at the same layer to realize the touch function of the display substrate. For example, the induction electrode includes a plurality of segments, and the excitation electrode is continuous. At the position where the excitation electrode and the induction electrode cross with each other, bridge electrodes located at different layers with the induction electrode and the excitation electrode are provided to electrically connect two adjacent segments of the induction electrode with each other. The touch sensitivity of the display substrate may be improved by arranging the induction electrode and the excitation electrode.

For example, the material for forming the auxiliary electrode layer 21130 may include indium tin oxide (ITO), thereby obtaining a transparent electrode, or the material for forming the auxiliary electrode layer 21130 may include a metal mesh, thereby also obtaining a transparent electrode.

It should be noted that the structure in the display region of the display substrate as shown in FIG. 7B is different from the structure in the display region of the display substrate as shown in FIG. 4 in that the display substrate in FIG. 7B is provided with a display region third insulation layer 21120 and an auxiliary electrode layer 21130 on the encapsulation layer without providing a passivation layer. Based on this, the structure of the same film layers of the display substrates in FIG. 7B and that in FIG. 4 and the materials for manufacturing the film layers will not be described in detail.

Figure 8A:
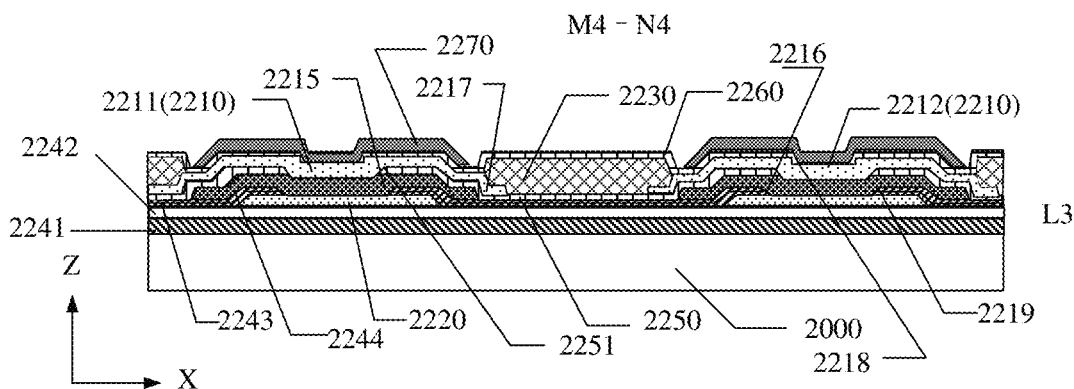
FIG. 8A is a schematic cross-sectional view taken along line M4-N4 of the display substrate as shown in FIG. 6 according to another embodiment of the present disclosure.

For example, in some examples of the present disclosure, FIG. 8A is a schematic cross-sectional view taken along line M4-N4 of the display substrate as shown in FIG. 6 provided by another embodiment of the present disclosure.

Compared with the structure in the bonding region as shown in FIG. 7A, the structure in the bonding region as shown in FIG. 8A adds a second insulation layer 2250 in the bonding region 2200 of the display substrate. The second insulation layer 2250 is between the first contact pad metal layer 2215 and the second contact pad metal layer 2217. The second insulation layer 2250 covers the edges of the first contact pad metal layer 2215 to prevent the edges of the first contact pad metal layer 2215 from being corroded by the etching solution in the subsequent patterning process. In addition, the first insulation layer 2230 covers the edges of the second contact pad metal layer 2217 to prevent the edges of the second contact pad metal layer 2217 from being corroded by the etching solution in the subsequent patterning process. For example, at the gap between the contact pad 2211 and the contact pad 2212, the second insulation layer 2250 is located between the first insulation layer 2230 and the bonding region interlayer insulation layer 2244. The second insulation layer 2250 includes first contact pad via holes 2251, and the second contact pad metal layer 2217 is electrically connected with the first contact pad metal layer 2215 through the first contact pad via holes 2251.

In at least one example, as shown in FIG. 8A, compared with the edges of the first contact pad metal layer 2215, the second contact pad metal layer 2217 extends further outward on the second insulation layer 2250 to cover the edges of the first contact pad metal layer 2215, that is, on the surface of the base substrate 2000, the orthographic projection of the second contact pad metal layer 2217 covers the orthographic projection of the first contact pad metal layer 2215. The above described structure may reduce the segment difference at the edges of the plurality of contact pads, and is advantageous for the first insulation layer 2230 to cover the edges of the second contact pad metal layer 2217.

Figure 8B:
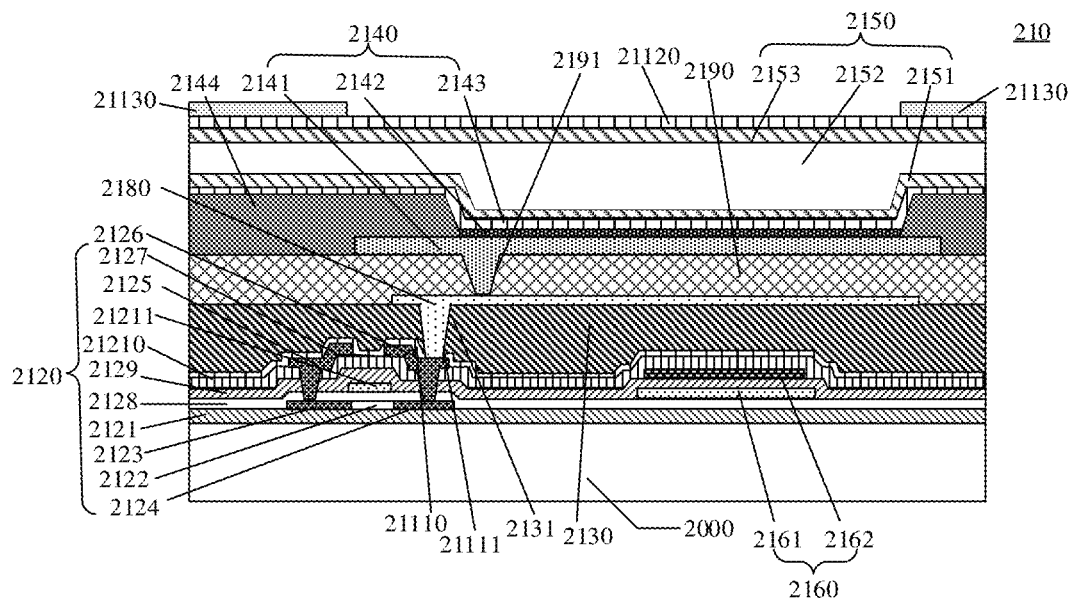
FIG. 8B is a schematic cross-sectional view of the display region of the display substrate as shown in FIG. 6 according to another embodiment of the present disclosure.

For example, in some examples of the present disclosure, FIG. 8B is a schematic cross-sectional view of the display region of the display substrate as shown in FIG. 6 according to another embodiment of the present disclosure.

Compared with the structure of the display substrate as shown in FIG. 7B, the structure of the display substrate as shown in FIG. 8B adds a passivation layer 21110 in the plurality of sub-pixels 210 in the display region of the display substrate. The passivation layer 21110 is located between the pixel drive circuit and the first planarization layer 2130, and includes a passivation layer via hole 21111. The passivation layer can protect the source electrode and drain electrode of the pixel drive circuit from being corroded by water vapor. The pixel drive circuit and the first transfer electrode 2180 may also be electrically connected through the passivation layer via hole 21111. The second insulation layer 2250 is provided at the same layer as the passivation layer 21110.

At least one embodiment of the present disclosure further provides a display device, which may include the display substrate of any one of the above embodiments.

For example, in some examples, the display device may further include a flexible circuit board and a control chip. For example, the flexible circuit board is bonded to the bonding region of the display substrate, and the control chip is installed on the flexible circuit board, thereby electrically connecting with the display region. Alternatively, the control chip is directly bonded to the bonding region, thereby being electrically connected with the display region.

For example, the control chip may be a central processing unit, a digital signal processor, a system chip (SoC), etc. For example, the control chip may also include a memory, a power supply module, etc., and power supply function and signal input and output function are realized through additionally arranged wires, signal lines, etc. For example, the control chip may further include a hardware circuit, computer executable code, etc. The hardware circuit may include conventional very large scale integration (VLSI) circuits or gate arrays, and existing semiconductors such as logic chips, transistors, or other discrete components. The hardware circuit may further include field programmable gate arrays, programmable array logic, programmable logic devices, etc.

For example, the display device provided by at least one embodiment of the present disclosure may be any product or component having a display function such as a mobile phone, a tablet computer, a television, a display, a notebook computer, a digital photo frame, a navigator, etc.

At least one embodiment of the present disclosure further provides a manufacturing method of a display substrate, which includes: providing a base substrate, in which the base substrate includes a display region and a bonding region located at at least one side of the display region; forming a plurality of sub-pixels in the display region; forming a plurality of data lines in the display region, in which the plurality of data lines are configured to provide data signals to the plurality of sub-pixels; forming a plurality of data leads in the bonding region, in which the plurality of data leads are electrically connected with the plurality of data lines; forming at least one group of contact pads in the bonding region, in which the at least one group of contact pads include a plurality of contact pads, at least one of the plurality of contact pads includes a first contact pad metal layer and a second contact pad metal layer, the first contact pad metal layer is formed to be located on a side of the plurality of data leads away from the base substrate and is electrically connected with one of the plurality of data leads, the second contact pad metal layer is formed to be located on a side of the first contact pad metal layer away from the base substrate and is electrically connected with the first contact pad metal layer, and the second contact pad metal layer covers an edge of the first contact pad metal layer; and forming a first insulation layer in the bonding region, in which the first insulation layer is located in gaps between the plurality of contact pads and covers edges of the plurality of contact pads, and is configured to expose surfaces of the plurality of contact pads facing away from the base substrate.

In the display substrate obtained by the manufacturing method of the above embodiment, the first insulation layer located in the bonding region of the display substrate is configured to expose the surfaces of the plurality of contact pads facing away from the base substrate and to cover the edges of the plurality of contact pad, so that in the manufacturing process of the display substrate, the first insulation layer can protect the edges of the metal layers of the plurality of contact pads, prevent the etching solution in the subsequent patterning process from etching the edges of the exposed surfaces of the plurality of contact pads, and further improve the product yield and reliability of the display substrate.

For example, in some examples of the present disclosure, forming the first insulation layer includes: causing the height of the first insulation layer relative to the surface of the base substrate to be not greater than the height of the plurality of contact pads relative to the surface of the base substrate.

In different embodiments, the first insulation layer in the bonding region may be formed at the same layer as different insulation layers in the display region, thereby obtaining different laminated structures in the bonding region.

For example, in some examples of the present disclosure, forming the plurality of sub-pixels in the display region includes: forming the plurality of sub-pixels in the display region, in which at least one of the plurality of sub-pixels includes a pixel drive circuit, a first planarization layer, and a light emitting element. Forming the plurality of sub-pixels in the display region includes: forming the pixel drive circuit on the base substrate, forming the first planarization layer on the side of the pixel drive circuit away from the base substrate to provide the first planarization surface, and forming the first via hole in the first planarization layer, forming the first transfer electrode on the first planarization surface, in which the first transfer electrode is electrically connected with the pixel drive circuit through the first via hole, forming the second planarization layer on the side of the first transfer electrode away from the base substrate to provide the second planarization surface, and forming the second via hole in the second planarization layer, in which the first insulation layer and the second planarization layer are formed by a same first insulation material layer; and forming the light emitting element on the second planarization surface, in which the light emitting element is electrically connected with the first transfer electrode through the second via hole.

For example, in some examples of the present disclosure, forming the first insulation layer and the second planarization layer through the same first insulation material layer includes: depositing the first insulation material layer on the base substrate after the plurality of contact pads and the pixel drive circuit are formed; performing a patterning process on the first insulation material layer such that a portion of the first insulation material layer located in the display region is formed as the second planarization layer and the second via hole is formed in the second planarization layer, removing a portion, being overlapped with the plurality of the contact pads, of the first insulation material layer, and thinning a portion, located in the bonding region and located at edges of the plurality of the contact pads, of the first insulation material layer to form the first insulation layer.

For example, in some examples of the present disclosure, performing a patterning process on the first insulation material layer includes: patterning the first insulation material layer by using a gray mask plate patterning process or a halftone mask plate patterning process.

Next, taking the manufacturing of the display substrate as shown in FIG. 5B as an example, the manufacturing method of the display substrate in the embodiments of the present disclosure will be described in detail with reference to FIG. 9A to FIG. 9M.

For example, the base substrate 1000 is provided. The base substrate 1000 includes the display region and the peripheral region surrounding the display region, and the peripheral region includes at least one bonding region located at at least one side of the display region. For example, the display region buffer layer 1121 is formed by a deposition method in the display region of the base substrate 1000 while the bonding region buffer layer 1241 is formed in the bonding region.

For example, the material of the base substrate 1000 may include an organic material, for example, the organic material may be a resin material such as polyimide, polycarbonate, polyacrylate, polyetherimide, polyethersulfone, polyethylene terephthalate, and polyethylene naphthalate, etc. The base substrate 1000 may be a flexible substrate or a non-flexible substrate, and the embodiments of the present disclosure are not limited thereto.

The materials of the display region buffer layer 1121 and the bonding region buffer layer 1241 may include insulation materials such as silicon oxide, silicon nitride, silicon oxynitride, etc.

For example, an active layer is formed on the display region buffer layer 1121. For example, a semiconductor material layer is deposited on the base substrate 1000, and then a patterning process is performed on the semiconductor material layer to form the active layer 1122. The active layer 1122 includes the source region 1123 and the drain region 1124.

For example, the semiconductor material of the active layer 1122 may include polysilicon or an oxide semiconductor (for example, indium gallium zinc oxide), etc.

For example, after the active layer 1122 is formed, the display region first gate insulation layer 1128 may be formed on the active layer 1212 by a deposition method or the like, and the bonding region first gate insulation layer 1242 may be formed on the bonding region buffer layer 1241 in the bonding region. The materials of the display region first gate insulation layer 1128 and the bonding region first gate insulation layer 1242 may include insulation materials such as silicon oxide, silicon nitride, silicon oxynitride, etc.

Figure 9A:
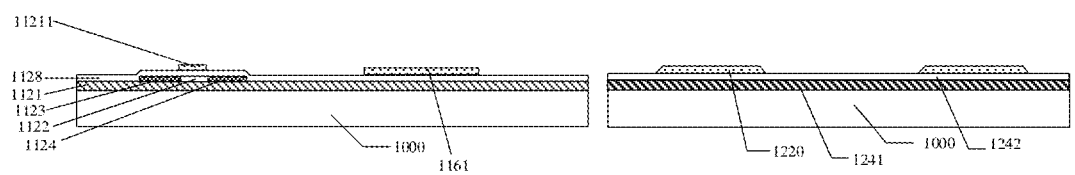
FIG. 9A to FIG. 9M are process diagrams of a manufacturing method of a display substrate according to some embodiments of the present disclosure.

For example, as shown in FIG. 9A, after the display region first gate insulation layer 1128 is formed, the gate electrode 11211 and the first capacitor electrode 1161 may be formed on the first gate insulation layer 1128 in the display region by a patterning process, and a plurality of leads 1220 may be formed on the base substrate 1000 in the bonding region. For example, a first metal material layer 1410 is deposited on the base substrate 1000, and then a patterning process is performed on the first metal material layer 1410 to form the gate electrode 11211, the first capacitor electrode 1161, and the plurality of leads 1220. The first metal material layer 1410 may adopt a metal material or an alloy material, such as a metal single-layer or a multi-layer structure formed by molybdenum, aluminum, titanium, etc., for example, the multi-layer structure is a multi-metal laminated layer (such as a three-layer metal laminated layer of titanium, aluminum, and titanium (Ti/Al/Ti).

In this step, in some examples, the gate electrode may be used as a mask, and the source region 1123 and the drain region 1124 that are conductive are formed by doping the active layer, while the channel region between the source region 1123 and the drain region 1124 is undoped due to the shielding effect of the gate electrode.

Figure 9B:
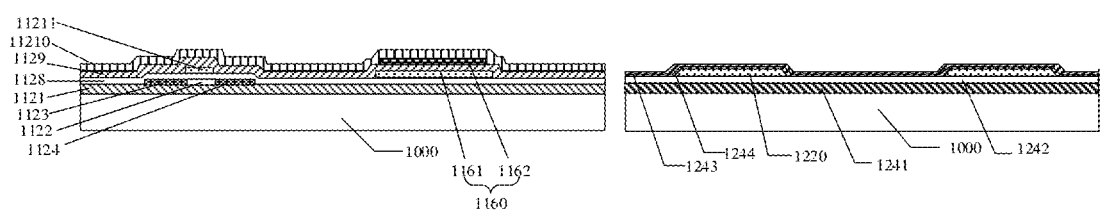

For example, as shown in FIG. 9B, after the gate electrode 11211, the first capacitor electrode 1161, and the plurality of leads 1220 are formed, an insulation material may be deposited on the base substrate by a deposition method or the like, the display region second gate insulation layer 1129 may be formed on the gate electrode 11211, and the bonding region second gate insulation layer 1243 may be formed on the plurality of leads 1220 by a patterning process in the bonding region. The bonding region second gate insulation layer 1243 includes first contact pad via holes 1216. The material of the bonding region second gate insulation layer may include, for example, insulation materials such as silicon oxide, silicon nitride, silicon oxynitride, etc.

For example, the second capacitance electrode 1162 is formed on the display region second gate insulation layer 1129, a metal material layer is deposited on the base substrate, and the second capacitance electrode 1162 is formed on a portion, which is overlapped with the first capacitance electrode 1161, by a patterning process. The first capacitance electrode 1161 and the second capacitance electrode 1162 are implemented as the storage capacitor 1160.

For example, after the second capacitor electrode 1162 is formed, the display region interlayer insulation layer 11210 may be formed in the display region by a deposition method or the like, and the bonding region interlayer insulation layer 1244 may be formed in the bonding region. The bonding region interlayer insulation layer 1244 includes second contact pad via holes 1219. The material of the bonding region interlayer insulation layer 1244 may include, for example, an insulation material such as silicon oxide, silicon nitride, silicon oxynitride, etc.

Figure 9C:
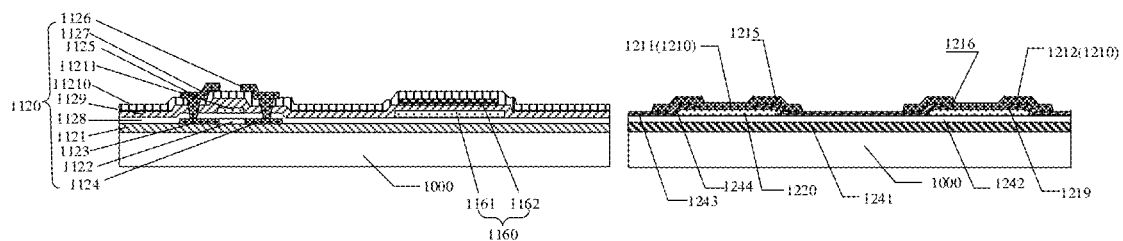

For example, as shown in FIG. 9C, via holes are formed in the display region first gate insulation layer 1128, the display region second gate insulation layer 1129, and the display region interlayer insulation layer 11210 to expose the source region 1123 and the drain region 1124 of the active layer 1122. The second metal material layer is formed on the base substrate by a deposition method or the like. The second metal material layer may adopt a metal material or an alloy material, such as a metal single-layer or a multi-layer structure formed by molybdenum, aluminum, titanium, etc., for example, the multi-layer structure is a multi-metal laminated layer (such as a three-layer metal laminated layer of titanium, aluminum, and titanium (Ti/Al/Ti).

Figure 9D:
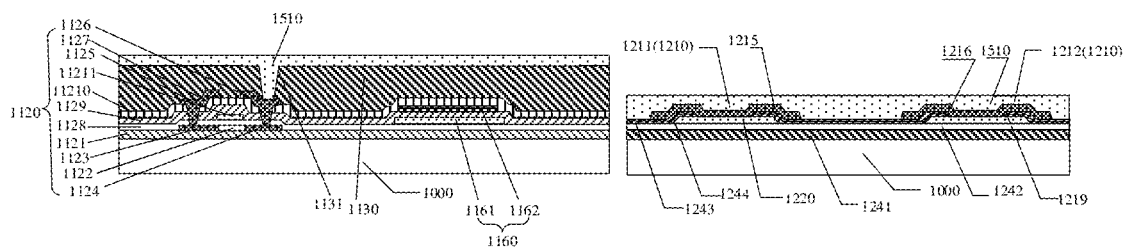

For example, the source electrode 1125 and the drain electrode 1126 are formed in the display region by a patterning process, and the first contact pad metal layer 1215 is formed in the bonding region. The source electrode 1125 and the drain electrode 1126 are electrically connected with the source region 1123 and the drain region 1124 respectively through the via holes in the display region first gate insulation layer 1128, the display region second gate insulation layer 1129, and the display region interlayer insulation layer 11210. The first contact pad metal layer 1215 is electrically connected with the plurality of leads 1220 through the first contact pad via holes 1216 in the bonding region second gate insulation layer 1243 and the second contact pad via holes 1219 in the bonding region interlayer insulation layer. For example, as shown in FIG. 9D, a first insulation material layer 1710 is deposited on the base substrate to cover the source electrode 1125 and the drain electrode 1126, and cover the display region interlayer insulation layer 11210. A photolithography process is performed on the first insulation material layer 1710 to form the first planarization layer 1130 in the display region to provide the planarization surface, and the first planarization layer 1130 includes the first via hole 1131. The first insulation material layer 1710 may adopt inorganic insulation materials such as silicon oxide, silicon nitride, silicon oxynitride, etc., or may adopt organic insulation materials such as polyimide, polyphthalimide, polyphthalamide, acrylic resin, benzocyclobutene, or phenolic resin, etc.

For example, after the pixel drive circuit 1120, the storage capacitor 1160, the first planarization layer 1130 located in the display region, and the plurality of leads 1220, the bonding region interlayer insulation layer 1244, and the first contact pad metal layer 1215 located in the bonding region are formed on the display substrate, a third metal material layer 1510 is deposited on the base substrate. The third metal material layer 1510 may adopt a metal material or an alloy material, such as a metal single-layer or a multi-layer structure formed by molybdenum, aluminum, titanium, etc.

Figure 9E:
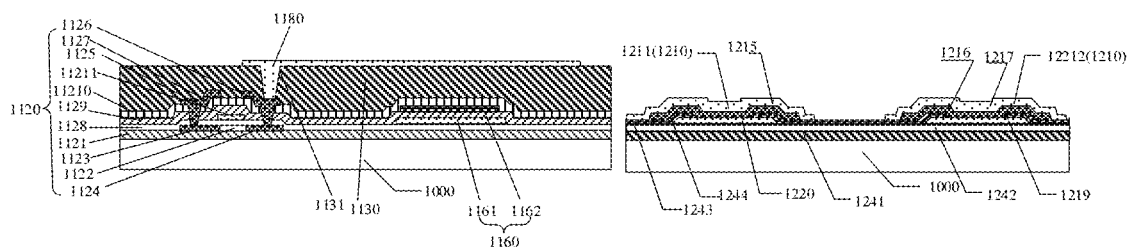

For example, as shown in FIG. 9E, a patterning process is performed on the third metal material layer 1510 to form the first transfer electrode 1180 in the display region and the second contact pad metal layer 1217 in the bonding region. The second contact pad metal layer 1217 covers the edges of the first contact pad metal layer 1215 to prevent the first contact pad metal layer 1215 from being corroded. In the present embodiment, the first contact pad metal layer 1215 and the second contact pad metal layer 1217 are laminated to realize the plurality of contact pads 1210.

Figure 9F:
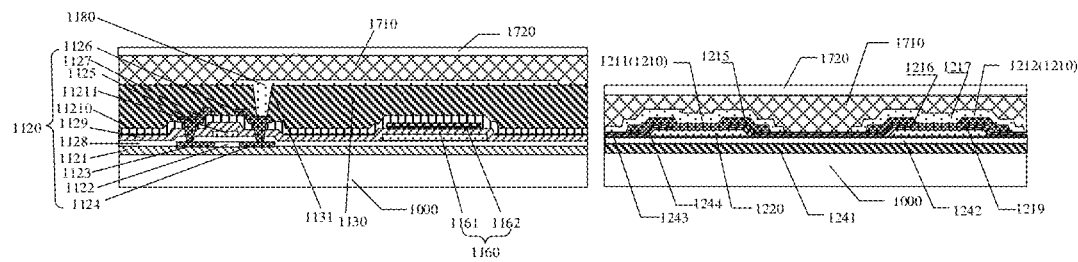

For example, as shown in FIG. 9F, the first insulation material layer 1710 is deposited on the base substrate, and a photoresist 1720 is deposited on the first insulation material layer 1710. The first insulation material layer 1710 may adopt an insulation material such as silicon oxide, silicon nitride, silicon oxynitride, etc.

Figure 9G:
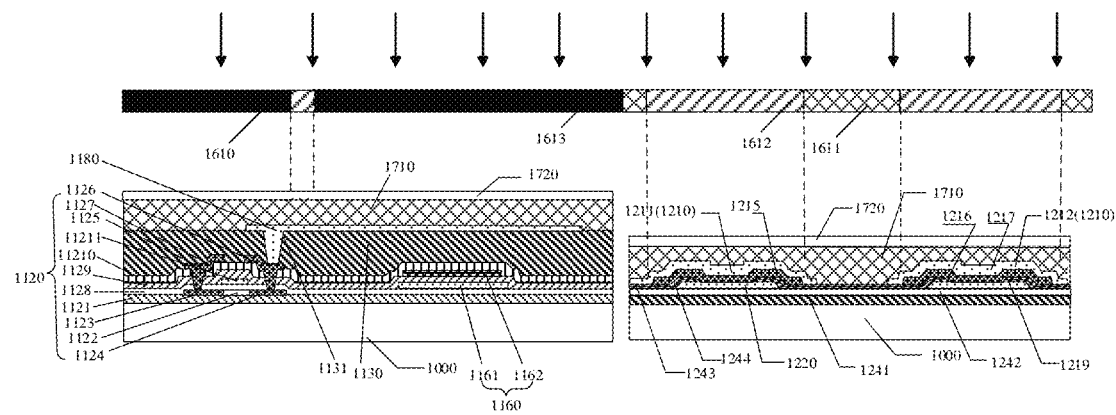

For example, as shown in FIG. 9G, a first mask 1610 is provided to expose the photoresist 1720. The first mask 1610 includes a completely transparent region, a partially transparent region, and a non-transparent region. In the bonding region, the first mask 1610 includes a first light-transmitting pattern 1611 that is overlapped with the gaps between the plurality of contact pads 1210, and a second light-transmitting pattern 1612 that is overlapped with the plurality of contact pads 1210. In the display region, the first mask 1610 includes the second light-transmitting pattern 1612 and a non-light-transmitting pattern 1613. The first light-transmitting pattern 1611 is located in the partially transparent region, the second light-transmitting pattern 1612 is located in the completely transparent region, and the non-light-transmitting pattern 1613 is located in the non-transparent region. That is, the first mask 1610 is a gray mask or a halftone mask. The photoresist is a positive photoresist, and correspondingly, the light transmittance of the first light-transmitting pattern 1611 is smaller than that of the second light-transmitting pattern 1612. In the exposure process, a portion of the photoresist 1720 corresponding to the first light-transmitting pattern 1611 may be partially exposed under the case where a portion of the photoresist 1720 corresponding to the second light-transmitting pattern 1612 is completely exposed. A portion of the photoresist 1720 corresponding to the non-light-transmitting pattern 1613 in the display region is not exposed.

For another example, negative photoresist may also be used in the patterning process described above, and in this case, the mask plate used is, for example, a mask plate complementary to the first mask plate 1610, so that the photoresist pattern 1721 and the photoresist pattern 1722 are obtained after an exposure process and a development process.

Figure 9H:
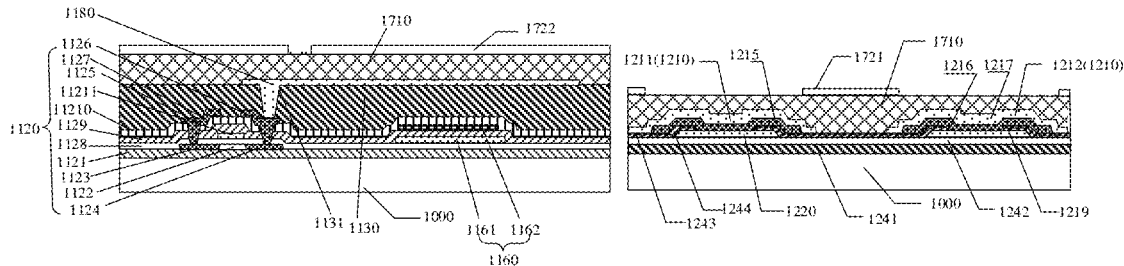

For example, as shown in FIG. 9H, the photoresist 1720 is developed, and the portion, which is fully exposed, of the photoresist 1720 is removed, that is, in the bonding region, the photoresist 1720 which is overlapped with the plurality of contact pads 1210 is removed. The portion, which is partially exposed, of the photoresist 1720 is thinned, and the thickness of the unexposed portion of the photoresist 1720 is, for example, substantially unchanged. After the development process, the photoresist 1720 is formed into the photoresist pattern 1721 in the bonding region. Similarly, in the display region, a portion, which is overlapped with the drain electrode 1126, of the photoresist 1720 is removed. After the development process, the photoresist 1720 is formed into the photoresist pattern 1722 in the display region.

Figure 9I:
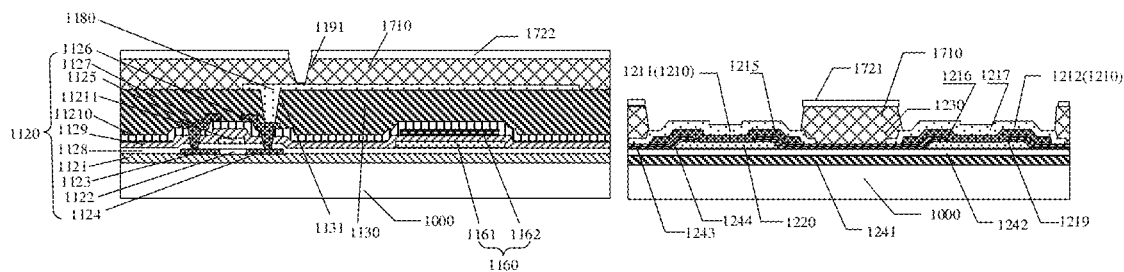

For example, as shown in FIG. 9I, the first insulation material layer 1710 in the bonding region and the display region is etched to remove the insulation material layer which is overlapped with the plurality of contact pads in the bonding region, and the second via hole 1191 is formed in the display region.

Figure 9J:
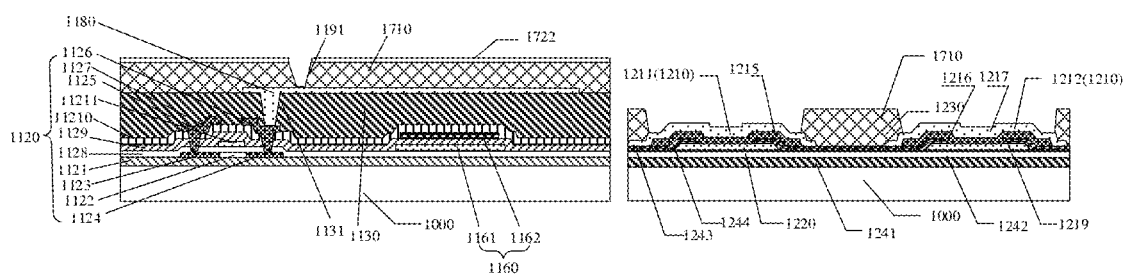

For example, as shown in FIG. 9J, after that, an ashing process is performed to remove the photoresist pattern 1721 in the bonding region and to thin the photoresist pattern 1722 in the display region, where the photoresist pattern 1722 in the display region is retained. Then, by using the current photoresist pattern, the remaining first insulation material layer 1710 in the bonding region is etched, and the etching thickness is controlled to form the first insulation layer 1230, so that the height of the etched first insulation layer 1230 with respect to the surface of the base substrate 1000 is caused to be not greater than the height of the second contact pad metal layer 1217 of the plurality of contact pads 1210 with respect to the surface of the base substrate 1000.

Figure 9K:
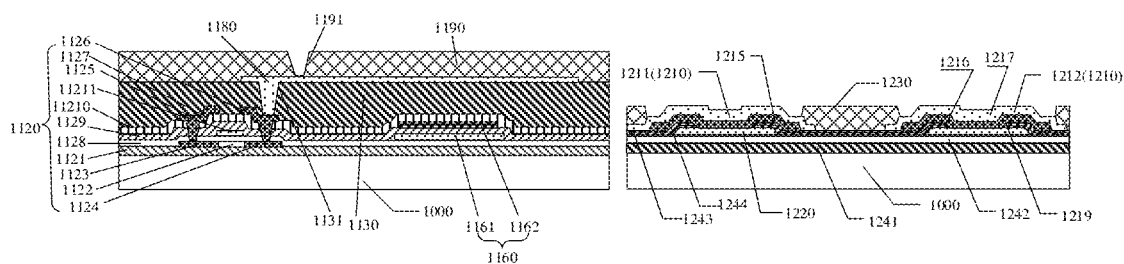

For example, as shown in FIG. 9K, the photoresist pattern 1722 in the display region is removed. The second planarization layer 1190 is formed in the display region to provide a planarization surface.

Figure 9L:
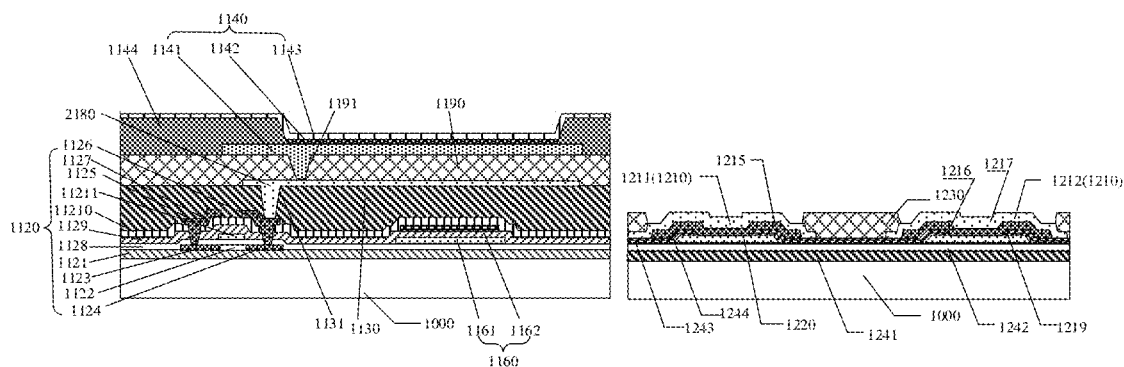

For example, as shown in FIG. 9L, the first electrode 1141 of the light emitting element 1140 is formed on the second planarization layer 1190 in the display region. The pixel defining layer 1144 is formed on the second planarization layer 1190 and the first electrode 1141, and the pixel defining layer 1144 includes a plurality of openings to define a plurality of pixel units. Each of the plurality of openings exposes a corresponding first electrode 1141. After that, the light emitting layer 1142 is formed in the plurality of openings of the pixel defining layer 1144 by, for example, a distillation process, and then the second electrode 1143 is formed on the pixel defining layer 1144 and the light emitting layer 1142. For example, the second electrode 1143 may be formed in a portion or an entire of the display region, so that the second electrode 1143 is formed to a whole surface in the manufacturing process. The first electrode 1141 of the light emitting element 1140 is electrically connected with the first transfer electrode 1180 through the second via hole 1191.

For example, the material of the first electrode 1141 may include at least one transparent conductive oxide material, including indium tin oxide (ITO), indium zinc oxide (IZO), zinc oxide (ZnO), etc. In addition, the first electrode 1141 may adopt a metal having high reflectivity as the reflective layer, such as silver (Ag).

For example, for OLED, the light emitting layer 1142 may adopt a small molecular organic material or a polymer molecular organic material, which may be a fluorescent light emitting material or a phosphorescent light emitting material, and may emit red light, green light, blue light, or white light. In addition, the light emitting layer may further include functional layers such as an electron injection layer, an electron transport layer, a hole injection layer, a hole transport layer, and the like as required. For QLED, the light emitting layer may adopt a quantum dot material, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc., and the particle size of the quantum dots is 2-20 nm.

For example, the second electrode 1143 may adopt various conductive materials. For example, the second electrode 1143 may adopt a metal material such as lithium (Li), aluminum (Al), magnesium (Mg), silver (Ag), etc.

For example, the material of the pixel defining layer 1144 may include organic insulation materials such as polyimide, polyphthalimide, polyphthalamide, acrylic resin, benzocyclobutene or phenolic resin, etc., or inorganic insulation materials such as silicon oxide, silicon nitride, etc., and the embodiments of the present disclosure are not limited thereto.

Figure 9M:
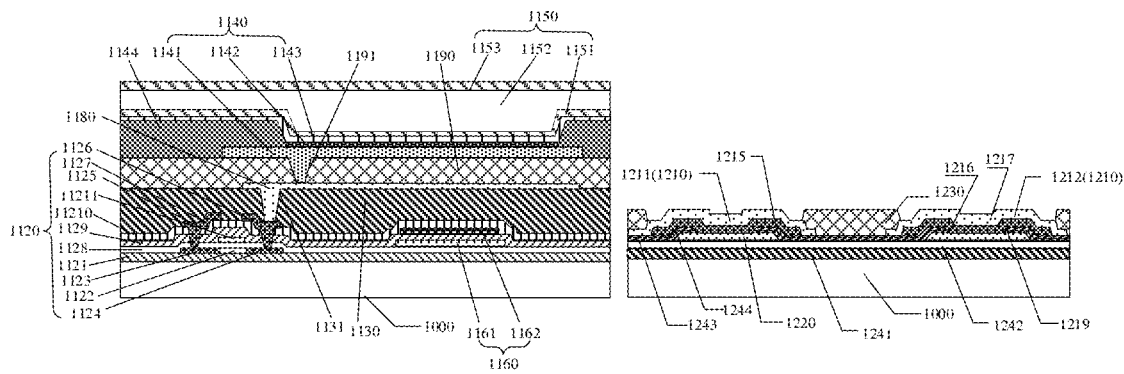

For example, as shown in FIG. 9M, the encapsulation layer 1150 is formed on the light emitting element 1140 in the display region. The encapsulation layer 1150 seals the light emitting element 1140, so that degradation of the light emitting element 1140 caused by moisture and/or oxygen included in the environment may be reduced or avoided.

The encapsulation layer 1150 may be a single-layer structure or a composite layer structure, and the composite layer structure includes a structure in which inorganic layers and organic layers are stacked. For example, the encapsulation layer 1150 may include the first inorganic encapsulation layer 1151, the first organic encapsulation layer 1152, and the second inorganic encapsulation layer 1153 which are sequentially arranged. The encapsulation layer 1150 may extend to the bonding region, and in the above example, the encapsulation layer does not cover the plurality of contact pads.

For example, the material of the encapsulation layer may include insulation materials such as silicon nitride, silicon oxide, silicon oxynitride, polymer resin, etc. Inorganic materials such as silicon nitride, silicon oxide, and silicon oxynitride have high compactness and can prevent invasion of water, oxygen, etc. The material of the organic encapsulation layer may be a polymer material containing a desiccant or a polymer material configured to block water vapor, for example, a polymer resin or the like to planarize the surface of the display substrate, and to relieve the stress of the first inorganic encapsulation layer and the second inorganic encapsulation layer. The material of the organic encapsulation layer may further include a water absorbent material such as a desiccant to absorb substances such as water and oxygen invading the interior of the display substrate.

In another example of the present disclosure, the manufacturing method of the display substrate as shown in FIG. 5B may include FIG. 9F to FIG. 9K, and the processes as shown in FIG. 9F to FIG. 9K may refer to the relevant descriptions of the above examples.

For example, in this example, the first insulation material layer 1710 may adopt a photosensitive resin material, such as a photoresist. For example, the photosensitive resin material is a positive photoresist. After the photosensitive resin material is coated to form a first material layer, an exposure performed is performed by using, for example, the above-mentioned first mask plate 1610. The first mask 1610 includes a completely transparent region, a partially transparent region, and a non-transparent region. In the bonding region, the first mask 1610 includes a first light-transmitting pattern 1611 that is overlapped with the gaps between the plurality of contact pads 1210, and a second light-transmitting pattern 1612 that is overlapped with the plurality of contact pads 1210. In the display region, the first mask 1610 includes the second light-transmitting pattern 1612 and a non-light-transmitting pattern 1613 that are overlapped with the drain electrode 1126. The first light-transmitting pattern 1611 is located in the partially transparent region, the second light-transmitting pattern 1612 is located in the completely transparent region, and the non-light-transmitting pattern 1613 is located in the non-transparent region.

In the exposure process, the portion of the first insulation material layer 1710 corresponding to the second light-transmitting pattern 1612 is completely exposed, the portion corresponding to the first light-transmitting pattern 1611 is partially exposed, and the portion corresponding to the non-light-transmitting pattern 1613 in the display region is not exposed. After the development process, the first insulation material layer 1710 that is unexposed in the display region is formed to a second planarization layer 1190. The first insulation material layer 1710 that is partially exposed in the bonding region is formed to the first insulation layer 1230, and the height of the formed first insulation layer 1230 relative to the surface of the base substrate 1000 is not greater than the height of the second contact pad metal layer 1217 of the plurality of contact pads 1210 relative to the surface of the base substrate 1000. Accordingly, the first insulation material layer 1710 that is fully exposed in the display region and the bonding region is removed to form the second via hole 1191 in the display region and expose the plurality of contact pads in the bonding region. The above manufacturing method may also obtain the display substrate of the embodiment as shown in FIG. 9K.

For another example, the photosensitive resin material may also be a negative photoresist, and the mask plate used in this case is, for example, a mask plate complementary to the first mask plate 1160, so that the second planarization layer is also formed in the display region after an exposure process and a development process, and the plurality of contact pads and the first insulation layer covering the edges of the plurality of contact pads are exposed in the bonding region.

In the display substrate obtained by the manufacturing method described above, the first insulation layer located in the bonding region of the display substrate is configured to expose the surfaces of the plurality of contact pads facing away from the base substrate and to cover the edges of the plurality of contact pads, so that in the manufacturing process of the display substrate, the first insulation layer can protect the edges of the metal layers of the plurality of contact pads, prevent the etching solution in the subsequent patterning process, in which the transfer metal layer is formed, from etching the edges of the exposed surfaces of the plurality of contact pads, and further improve the product yield and reliability of the display substrate.

For another example, in another embodiment, a manufacturing method corresponding to the display substrate as shown in FIG. 4 is provided. Compared with the structure in the bonding region shown in FIG. 5B, the structure in the bonding region shown in FIG. 4 adds the second insulation layer 1250 in the bonding region 1200 of the display substrate. The second insulation layer 1250 is arranged between the first contact pad metal layer 1215 and the second contact pad metal layer 1217. And the second insulation layer 1250 covers the edges of the first contact pad metal layer 1215 to prevent the edges of the first contact pad metal layer 1215 from being corroded by the etching solution in the subsequent patterning process. Furthermore, the second contact pad metal layer 1217 extends further outward on the second insulation layer 1250 than the edges of the first contact pad metal layer 1215 to cover the edges of the first contact pad metal layer 1215, that is, on the surface of the base substrate 1000, the orthographic projection of the second contact pad metal layer 1217 covers the orthographic projection of the first contact pad metal layer 1215. This structure may reduce the segment difference at the edges of the plurality of contact pads, and is advantageous for the first insulation layer 1230 to cover the edges of the second contact pad metal layer 1217. Similarly, the passivation layer 11110 is arranged in the plurality of sub-pixels in the display region of the display substrate. The passivation layer 11110 is located between the pixel drive circuit 1120 and the first planarization layer 1130 and includes the passivation layer via hole 11111. The passivation layer can protect the source electrode and the drain electrode of the pixel drive circuit from being corroded by water vapor. The pixel drive circuit and the first transfer electrode 1180 are also electrically connected through the passivation layer via hole 11111. In the bonding region, the second insulation layer 1250 is provided at the same layer as the passivation layer 11110.

In the present embodiment, the step of forming the passivation layer may be added between the steps of FIG. 9C and FIG. 9D. For example, on the basis of the structure as shown in FIG. 9C, a passivation layer film is formed to cover the source electrode 1125 and the drain electrode 1126, and to cover the display region interlayer insulation layer 11210, and then the passivation layer film is patterned to form a via hole configured to expose the drain electrode 1126 in the display region and the passivation layer via hole 11111 configured to expose the first contact pad metal layer 1215 in passivation layer. Then, referring to FIG. 9D, the deposition of the first insulation material layer 1710 on the base substrate is continued to cover the passivation layer.

For example, the material of the passivation layer may include an organic insulation material or an inorganic insulation material, such as silicon nitride material, which can well protect the pixel drive circuit from water vapor corrosion due to its high dielectric constant and good hydrophobic function.

For another example, in another embodiment, a manufacturing method corresponding to the display substrate as shown in FIG. 7A and FIG. 7B is provided. On the basis of the structure as shown in FIG. 9L, it is possible to continue to form the display region third insulation layer 21120 on the base substrate. The display region third insulation layer 21120 is arranged on the light emitting element 2140 to cover the light emitting element 2140, and provides a planarization surface on the side of the light emitting element 2140 away from the base substrate 2000. Then, an auxiliary conductive layer is formed on the third insulation layer 21120 in the display region, and the auxiliary conductive layer may include the auxiliary electrode layer 21130 in the display region. The auxiliary electrode layer 21130 is arranged on the display region third insulation layer 21120. The auxiliary electrode layer 21130 can be configured to realize other auxiliary functions, such as a touch function.

The material of the display region third insulation layer 21120 may include organic insulation materials such as polyimide, polyphthalimide, polyphthalamide, acrylic resin, benzocyclobutene or phenolic resin, etc., or inorganic insulation materials such as silicon oxide, silicon nitride, etc., and the embodiments of the present disclosure are not limited thereto. For example, the auxiliary electrode layer for realizing the touch function may be used to realize a capacitive touch structure, which is of a self-capacitance type or a mutual capacitance type.

In various embodiments of the present disclosure, the flow of the manufacturing method of the display device may include more or less operations, and these operations may be performed sequentially or in parallel. Although the flow of the manufacturing method described above includes a plurality of operations occurring in a specific order, it should be clearly understood that the order of the plurality of operations is not limited. The manufacturing method described above may be performed at one time or multiple times according to a predetermined condition.

Regarding the technical effect of the manufacturing method of the display device provided in the above embodiments, reference can be made to the technical effect of the display device provided in the embodiments of the present disclosure, which will not be repeated here.

The following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiments can be combined with each other to obtain new embodiments.

The above are merely specific implementations of the present disclosure without limiting the protection scope of the present disclosure thereto. The protection scope of the present disclosure should be based on the protection scope of the appended claims.

What is claimed is:

1. A display substrate, comprising:
   a base substrate, comprising a display region and a bonding region located at at least one side of the display region;
   a plurality of sub-pixels, located in the display region;
   a plurality of data lines, located in the display region and configured to provide data signals to the plurality of sub-pixels;
   a plurality of data leads, located in the bonding region and electrically connected with the plurality of data lines;
   at least one group of contact pads, located in the bonding region, wherein the at least one group of contact pads comprise a plurality of contact pads, at least one of the plurality of contact pads comprises a first contact pad metal layer and a second contact pad metal layer, the first contact pad metal layer is located on a side of the plurality of data leads away from the base substrate and is electrically connected with one of the plurality of data leads, the second contact pad metal layer is located on a side of the first contact pad metal layer away from the base substrate and is electrically connected with the first contact pad metal layer, and the second contact pad metal layer covers an edge of the first contact pad metal layer;
   a first insulation layer, located in the bonding region, wherein the first insulation layer is located in gaps between the plurality of contact pads and covers edges of the plurality of contact pads, and is configured to expose surfaces of the plurality of contact pads facing away from the base substrate; and
   a bonding region third insulation layer, wherein the bonding region third insulation layer is located in the bonding region, and is provided on a side of the first insulation layer and the plurality of contact pads away from the base substrate to cover the first insulation layer and the plurality of contact pads, and the bonding region third insulation layer comprises third contact pad via holes to expose surfaces of the plurality of the contact pads.

2. The display substrate according to claim 1, wherein a vertical distance between a surface of a side of the first insulation layer away from the base substrate and the base substrate is not greater than a vertical distance between a surface of a side of the plurality of contact pads away from the base substrate and the base substrate.

3. The display substrate according to claim 1, wherein edges of the second contact pad metal layer are covered by the first insulation layer.

4. The display substrate according to claim 1, wherein the at least one group of contact pads comprise a first group of contact pads and a second group of contact pads, the first group of contact pads and the second group of contact pads respectively comprise a plurality of contact pads, the second group of contact pads are located at a side of the first group of contact pads closer to the display region, and the plurality of data leads are electrically connected with the first group of contact pads and the second group of contact pads in one-to-one correspondence.

5. The display substrate according to claim 4, wherein at least a portion of the first insulation layer is located in gaps between adjacent contact pads of the first group of contact pads.

6. The display substrate according to claim 4, wherein at least a portion of the first insulation layer is located in gaps between adjacent contact pads of the second group of contact pads.

7. The display substrate according to claim 4, wherein at least a portion of the first insulation layer is located in gaps between adjacent contact pads of the first group of contact pads, and is further located in gaps between adjacent contact pads of the second group of contact pads.

8. The display substrate according to claim 4, wherein the plurality of contact pads of the first group of contact pads are arranged in at least a first row, and the plurality of contact pads of the second group of contact pads are arranged in at least a second row;
a row direction of the first row and a row direction of the second row are parallel to an extension direction of a side edge of the display region facing the bonding region, and
at least a portion of the first insulation layer is located in a gap between the first row and the second row.

9. The display substrate according to claim 1, wherein at least one of the plurality of sub-pixels comprises a pixel drive circuit, a first planarization layer, a first transfer electrode, a second planarization layer, and a light emitting element,
the first planarization layer is located on a side of the pixel drive circuit away from the base substrate to provide a first planarization surface and comprises a first via hole,
the first transfer electrode is on the first planarization surface and is electrically connected with the pixel drive circuit through the first via hole,
the second planarization layer is located on a side of the first transfer electrode away from the base substrate to provide a second planarization surface and comprises a second via hole,
the light emitting element is on the second planarization surface and is electrically connected with the first transfer electrode through the second via hole, and
the first insulation layer and the second planarization layer are provided at a same layer.

10. The display substrate according to claim 9, wherein the pixel drive circuit comprises a first display region metal layer,
the first display region metal layer and the first contact pad metal layer are provided at a same layer, and
the first transfer electrode and the second contact pad metal layer are provided at a same layer.

11. The display substrate according to claim 10, wherein the pixel drive circuit comprises a thin film transistor, the thin film transistor comprises a source electrode and a drain electrode, and
the source electrode and the drain electrode are located in the first display region metal layer and are located on the same layer as the first display region metal layer.

12. The display substrate according to claim 9, wherein at least one of the plurality of sub-pixels further comprises a passivation layer, and the passivation layer is located between the pixel drive circuit and the first planarization layer and comprises a passivation layer via hole,
the pixel drive circuit and the first transfer electrode are further electrically connected through the passivation layer via hole,
the display substrate further comprises a second insulation layer located in the bonding region, the second insulation layer is between the first contact pad metal layer and the second contact pad metal layer and covers edges of the first contact pad metal layer,
the second insulation layer comprises first contact pad via holes, and the second contact pad metal layer is electrically connected with the first contact pad metal layer through the first contact pad via holes, and
the second insulation layer and the passivation layer are provided at a same layer.

13. The display substrate according to claim 9, further comprising:
a bonding region interlayer insulation layer, located in the bonding region, located between the plurality of contact pads and the plurality of data leads, and located between the first insulation layer and the base substrate;
a bonding region first gate insulation layer, located in the bonding region, and located at a side of the bonding region interlayer insulation layer closer to the base substrate; and
a bonding region second gate insulation layer, located in the bonding region, located between the bonding region first gate insulation layer and the bonding region interlayer insulation layer, and laminated with the bonding region interlayer insulation layer;
wherein the bonding region second gate insulation layer comprises first contact pad via holes, the bonding region interlayer insulation layer comprises second contact pad via holes, and at least one of the plurality of data leads is electrically connected with at least one of the plurality of contact pads through the first contact pad via holes and the second contact pad via holes.

14. The display substrate according to claim 13, wherein at least one of the plurality of sub-pixels further comprises a display region interlayer insulation layer, a display region first gate insulation layer, and a display region second gate insulation layer,
the display region interlayer insulation layer, the display region first gate insulation layer, and the display region second gate insulation layer are respectively provided at the same layer as the bonding region interlayer insulation layer, the bonding region first gate insulation layer, and the bonding region second gate insulation layer;
the display region interlayer insulation layer is located between a gate electrode and the source electrode, and the drain electrode, the display region first gate insulation layer is located at a side of the display region interlayer insulation layer close to the base substrate, and the display region second gate insulation layer is located between the display region interlayer insulation layer and the display region first gate insulation layer; and the two capacitance electrodes comprise a first capacitance electrode and a second capacitance electrode, the first capacitance electrode is provided at the same layer as the gate electrode, and the second capacitance electrode is provided between the display region interlayer insulation layer and the display region second gate insulation layer.

15. The display substrate according to claim 1, further comprising an encapsulation layer and a display region third insulation layer that are located in the display region, wherein the encapsulation layer is located on a side of the light emitting element away from the base substrate, the display region third insulation layer is located on a side of the encapsulation layer away from the base substrate, and the bonding region third insulation layer and the display region third insulation layer are located at a same layer.

16. The display substrate according to claim 15, further comprising an auxiliary conductive layer, wherein the auxiliary conductive layer is located in the bonding region and is provided on a side of the bonding region third insulation layer away from the base substrate, the auxiliary conductive layer comprises a second transfer electrode pattern located in the bonding region, and the second transfer electrode pattern is electrically connected with the plurality of contact pads through the third contact pad via holes;

the display substrate further comprises an auxiliary electrode layer provided on the display region third insulation layer, and the auxiliary electrode layer and the second transfer electrode pattern are provided at a same layer.

17. The display substrate according to claim 16, wherein in the bonding region, a height of the second transfer electrode pattern relative to a surface of the base substrate is not greater than a height of the bonding region third insulation layer relative to the surface of the base substrate.

18. A display device, comprising the display substrate according to claim 1.

19. A manufacturing method of a display substrate, comprising:

providing a base substrate, wherein the base substrate comprises a display region and a bonding region located at at least one side of the display region;

forming a plurality of sub-pixels in the display region;

forming a plurality of data lines in the display region, wherein the plurality of data lines are configured to provide data signals to the plurality of sub-pixels;

forming a plurality of data leads in the bonding region, wherein the plurality of data leads are electrically connected with the plurality of data lines;

forming at least one group of contact pads in the bonding region, wherein the at least one group of contact pads comprise a plurality of contact pads, at least one of the plurality of contact pads comprises a first contact pad metal layer and a second contact pad metal layer, the first contact pad metal layer is formed to be located on a side of the plurality of data leads away from the base substrate and is electrically connected with one of the plurality of data leads, the second contact pad metal layer is formed to be located on a side of the first contact pad metal layer away from the base substrate and is electrically connected with the first contact pad metal layer, and the second contact pad metal layer covers an edge of the first contact pad metal layer;

forming a first insulation layer in the bonding region, wherein the first insulation layer is located in gaps between the plurality of contact pads and covers edges of the plurality of contact pads, and is configured to expose surfaces of the plurality of contact pads facing away from the base substrate; and forming a bonding region third insulation layer in the bonding region, and the bonding region third insulation layer is provided on a side of the first insulation layer and the plurality of contact pads away from the base substrate to cover the first insulation layer and the plurality of contact pads, and the bonding region third insulation layer comprises third contact pad via holes to expose surfaces of the plurality of the contact pads.

* * * * *